(12) United States Patent
Ho et al.

(10) Patent No.: US 10,910,532 B2
(45) Date of Patent: Feb. 2, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Hsin-Ying Ho, Kaohsiung (TW); Hsun-Wei Chan, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/198,511

(22) Filed: Nov. 21, 2018

(65) Prior Publication Data

US 2019/0181311 A1    Jun. 13, 2019

Related U.S. Application Data

(60) Provisional application No. 62/596,591, filed on Dec. 8, 2017.

(51) Int. Cl.
| | | |
|---|---|---|
| *H01L 33/58* | (2010.01) | |
| *H01L 25/16* | (2006.01) | |
| *H01L 33/52* | (2010.01) | |
| *H01L 33/60* | (2010.01) | |
| *H03K 17/00* | (2006.01) | |

(52) U.S. Cl.
CPC ............ *H01L 33/58* (2013.01); *H01L 25/167* (2013.01); *H01L 33/52* (2013.01); *H01L 33/60* (2013.01); *H03K 17/00* (2013.01); *H01L 2933/005* (2013.01); *H01L 2933/0058* (2013.01)

(58) Field of Classification Search
CPC ......... H01L 33/58; H01L 33/52; H01L 33/54; H01L 33/56; H01L 25/167; H03K 17/9631; H03K 17/00; H03K 17/945; H03K 17/96
See application file for complete search history.

(56) References Cited

U.S. PATENT DOCUMENTS

| | | | | |
|---|---|---|---|---|
| 6,345,903 B1* | 2/2002 | Koike | .................... | H01L 33/486 |
| | | | | 257/E33.059 |
| 7,534,663 B2* | 5/2009 | Ogawa | .................... | H01L 24/97 |
| | | | | 438/127 |
| 8,946,620 B2* | 2/2015 | Loong | .................... | G01S 7/4813 |
| | | | | 250/221 |
| 2011/0215347 A1* | 9/2011 | Wong | ..................... | H01L 33/00 |
| | | | | 257/89 |
| 2014/0021491 A1 | 1/2014 | Meng et al. | | |
| 2014/0197305 A1* | 7/2014 | Hsu | ........................ | G01S 7/4813 |
| | | | | 250/208.2 |
| 2016/0306072 A1 | 10/2016 | A Tharumalingam | | |

\* cited by examiner

*Primary Examiner* — Cuong Q Nguyen
*Assistant Examiner* — Shih Tsun A Chou
(74) *Attorney, Agent, or Firm* — Foley & Lardner LLP

(57) ABSTRACT

A semiconductor device package is provided, which includes a carrier, an emitter and a first transparent encapsulant. The carrier has a first surface. The emitter is disposed on the first surface. The first transparent encapsulant encapsulates the emitter. The first transparent encapsulant includes a body and a lens portion. The body has a first planar surface. The lens portion is disposed on the body and has a first planar surface. The first planar surface of the lens portion is substantially coplanar with the first planar surface of the body.

22 Claims, 28 Drawing Sheets

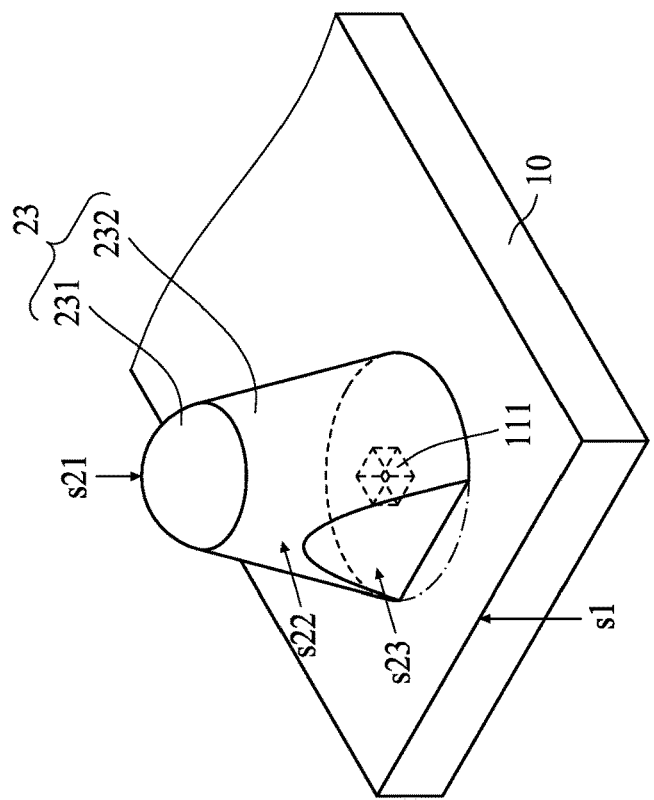
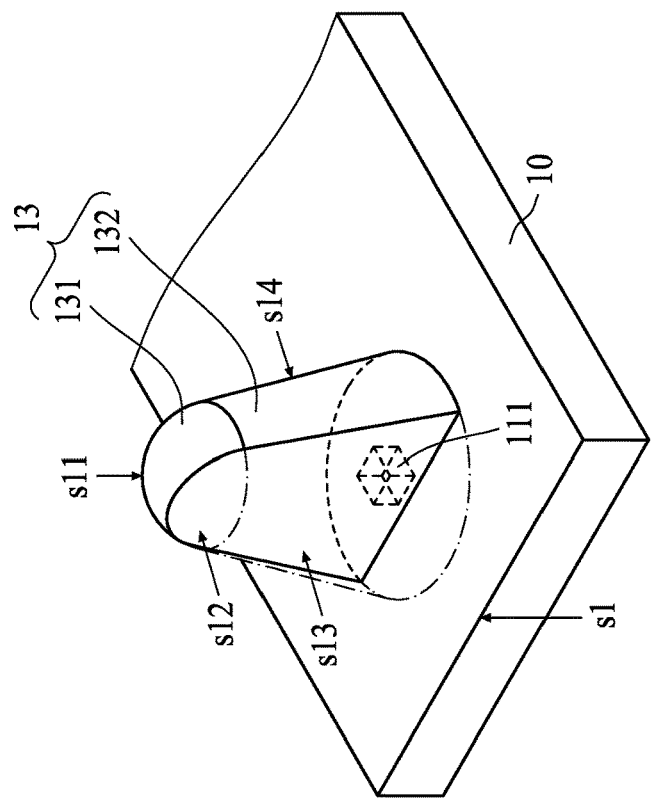
FIG. 2B
FIG. 2A

SEMICONDUCTOR DEVICE PACKAGE AND METHOD OF MANUFACTURING THE SAME

CROSS-REFERENCE TO RELATED APPLICATION

This application claims the benefit of and priority to U.S. Provisional Application No. 62/596,591, filed Dec. 8, 2017, the contents of which are incorporated herein by reference in their entirety.

BACKGROUND

1. Technical Field

The subject application relates generally to a semiconductor device package and a method of manufacturing the same. More particularly, the subject application relates to a semiconductor device package including a proximity sensor and a method of manufacturing the same.

2. Description of the Related Art

In a semiconductor device package, a proximity sensor is used for sensing an object within a short distance. The proximity sensor includes an emitter for emitting beams to the object, and a sensor for receiving beams reflected by the object. To avoid crosstalk induced by a cover glass, a lid is disposed above the emitter and the sensor to limit the incident angle of the beams. However, the lid also blocks the reflected beams when the object is close to the cover glass. As a result, the sensor may not sense the reflected beams when the object is close to the sensor.

SUMMARY

Some embodiments of the subject application provide a semiconductor device package which includes a carrier, an emitter and a first transparent encapsulant. The carrier has a first surface. The emitter is disposed on the first surface. The first transparent encapsulant encapsulates the emitter. The first transparent encapsulant includes a body and a lens portion. The body has a first planar surface. The lens portion is disposed on the body and has a first planar surface. The first planar surface of the lens portion is substantially coplanar with the first planar surface of the body.

Some embodiments of the subject application provide a semiconductor device package which includes a carrier, an emitter and a first transparent encapsulant. The carrier has a first surface. The emitter is disposed on the first surface. The first transparent encapsulant encapsulates the emitter, and includes a body and a lens portion. The body has a first surface and a first planar surface. The lens portion is disposed on the body and has a curved surface. The first surface of the body extends from the curved surface of the lens portion toward the carrier. The first planar surface of the body extends from the first surface of the body toward the carrier.

Some embodiments of the subject application provide a method of forming a semiconductor device package. The method includes disposing an emitter on and adjacent to a first side of a carrier. The method further includes encapsulating the emitter by a first transparent encapsulant having a lens portion and a body. The method further includes removing a part of the first transparent encapsulant adjacent to an edge of the first side of the carrier and forming a first planar surface on the body. The body has a first surface.

BRIEF DESCRIPTION OF THE DRAWINGS

Aspects of the subject application are best understood from the following detailed description when read with the accompanying drawings. It is noted that various features may not be drawn to scale, and the dimensions of the various features may be arbitrarily increased or reduced for clarity of discussion.

FIG. 2A illustrates a perspective view of a portion of a semiconductor device package in accordance with some embodiments of the subject application.

FIG. 2B illustrates a perspective view of a portion of a semiconductor device package in accordance with some embodiments of the subject application.

Common reference numerals are used throughout the drawings and the detailed description to indicate the same or similar elements. The subject application will be more apparent from the following detailed description taken in conjunction with the accompanying drawings.

DETAILED DESCRIPTION

Figure 1A:
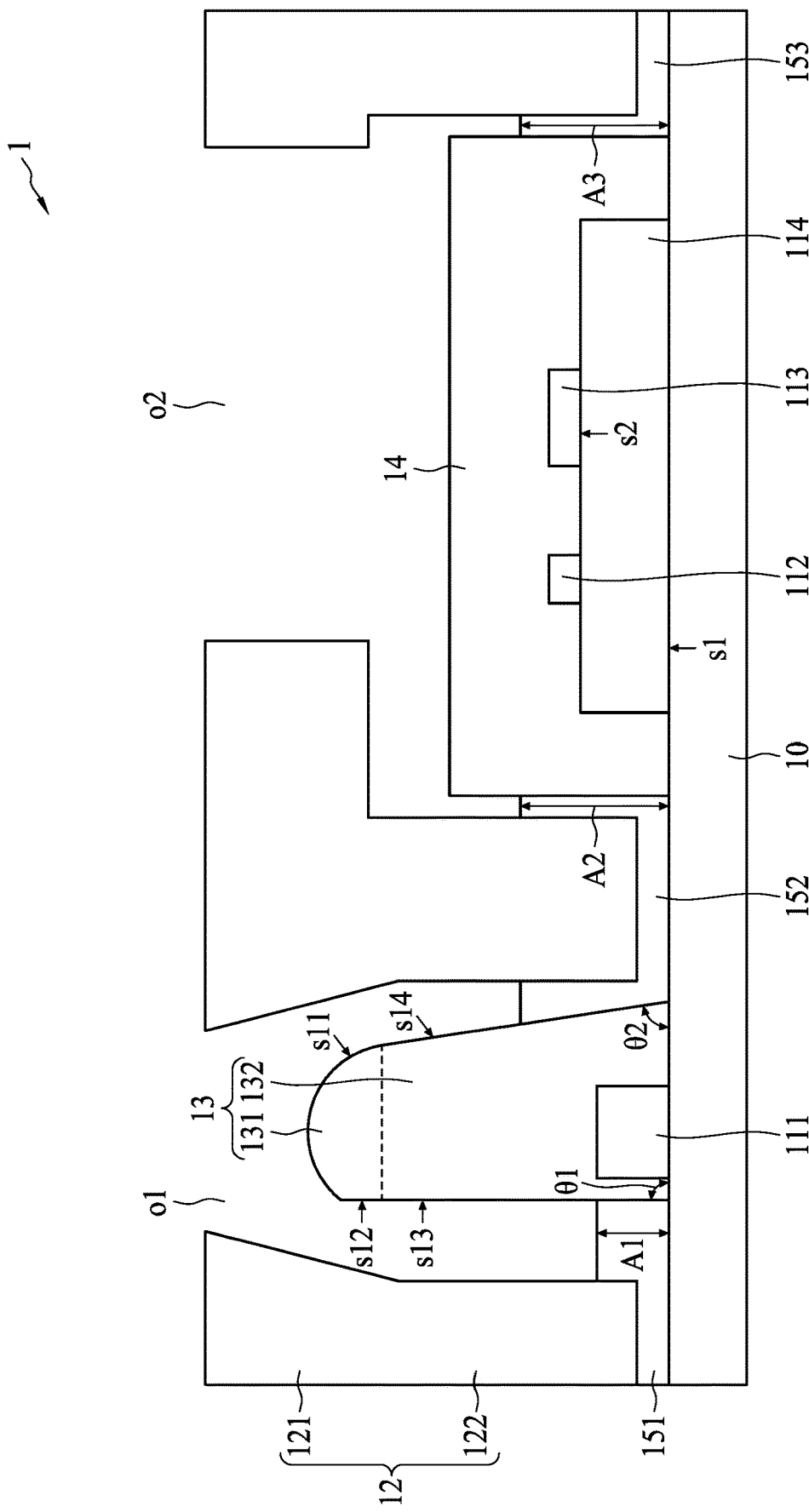
FIG. 1A illustrates a cross-sectional view of a semiconductor device package in accordance with some embodiments of the subject application.

The manufacturing and use of the embodiments of the subject application are discussed in detail below. It should be appreciated, however, that the embodiments cover many applicable concepts that can be embodied in a wide variety of specific contexts. It is to be understood that the following disclosure provides many different embodiments or examples of implementing different features of various embodiments. Specific examples of components and arrangements are described below for discussion purposes. Such examples are illustrative and are not intended to be limiting.

Embodiments or examples illustrated in the drawings are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of the subject application.

In addition, the subject application may repeat reference numerals and/or letters in the various examples. This repetition is for the purpose of simplicity and clarity and does not in itself indicate a relationship between the various embodiments and/or configurations discussed.

FIG. 1A illustrates a cross-sectional view of a semiconductor device package 1 in accordance with some embodiments of the subject application. The semiconductor device package 1 includes a carrier 10, an emitter 111, sensors 112 and 113, a semiconductor device 114, a lid 12, transparent encapsulants 13 and 14 and adhesives 151, 152 and 153.

In some embodiments, the carrier 10 may include circuitry therein and/or thereon. The carrier 10 may include conductive traces. The carrier 10 may include conductive pads. The carrier 10 may include conductive vias. The carrier 10 may include semiconductor material. The carrier 10 may include conductive material. The carrier 10 may include insulation material (e.g. dielectric material). The carrier 10 may include a redistribution layer(s) (RDL(s)). The carrier 10 may include a redistribution layer(s) (RDL(s)). The carrier 10 may include bismaleimide triazine (BT), FR4, prepreg (PP) or other suitable substrate materials. The carrier 10 has a surface s1.

The emitter 111 may include a light-emitting diode (LED) die, a laser diode/die (e.g. a vertical-cavity surface-emitting laser (VCSEL)), or the like. The emitter 111 is disposed on the surface s1 of the carrier 10. The emitter 111 may generate light beams of different wavelengths. In some embodiments, the emitter 111 may generate light beams.

The sensors 112 and 113 are disposed on a surface s2 of the semiconductor device 114. The sensor 113 is aligned with or adjacent to the center of an opening o2 of the lid 12 to have a symmetric and large receiving angle. The sensor 112 is disposed relatively close to the emitter 111 compared to the sensor 113. In some embodiments, the sensor 112 is a proximity sensor (PS). In some embodiments, the sensor 113 is an ambient light sensor (ALS). In some embodiments, the sensors 112 and 113 may be preferably designed to better receive light, light beams or rays emitted from the emitter 111.

The semiconductor device 114 is disposed on the surface s1 of the carrier 10. The semiconductor device 114 is disposed adjacent to the emitter 111. In some embodiments, the semiconductor device 114 may include a controller die, such as an application-specific integrated circuit (ASIC) die. In some embodiments, one or both of the sensors 112 and 113 may be integrated into the semiconductor device 114.

The lid 12 may include opaque material. The lid 12 may include plastic material, polymer, resin, metal, metal alloy or other suitable materials. The lid 12 is disposed on the surface s1 of the carrier 10. The lid 12 may include a wall (not denoted in FIG. 1A) between the emitter 111 and the sensor 112 to prevent light beams or rays emitted by the emitter 111 from directly arriving at the sensor 112. Light beams or rays may pass through the opening o2 and arrive at the sensor 112. The lid 12 may include a wall (not denoted in FIG. 1A) between the emitter 111 and the sensor 113 to prevent light beams or rays emitted by the emitter 111 from directly arriving at the sensor 113. The lid 12 may include a wall (not denoted in FIG. 1A) between the emitter 111 and the semiconductor device 114 to prevent light beams or rays emitted by the emitter 111 from directly arriving at the semiconductor device 114.

The lid 12 has an upper portion 121 and a lower portion 122. The lid 12 defines or has openings o1 and o2. The upper portion 121 of the lid 12 defines the opening o1. The upper portion 121 of the lid 12 defines the opening o2.

The opening o1 is aligned with the emitter 111. The opening o1 is above the emitter 111. The opening o1 exposes the emitter 111. Light, light beams or rays emitted from the emitter 111 may pass through the opening o1.

The opening o2 is aligned with the sensor 113. The opening o2 is above the sensor 113. The opening o2 exposes the sensor 113. Light, light beams or rays may pass through the opening o2 and arrive at the sensor 113. The opening o2 is aligned with the sensor 112. The opening o2 is aligned with the sensor 113. The opening o2 is above the sensor 112. The opening o2 is above the sensor 113. The opening o2 exposes the sensor 112. The opening o2 exposes the sensor 113.

The transparent encapsulant 13 may include transparent material. Light, light beams or rays may pass through the transparent encapsulant 13. The transparent encapsulant 13 is disposed on the surface s1 of the carrier 10. The transparent encapsulant encapsulates the emitter 111.

The transparent encapsulant 13 has a lens portion 131 and a body 132. The body 132 is on the surface s1 of the carrier 10. The lens portion 131 is on the body 132. The lens portion 131 has a curved surface s11 and a planar surface s12. The body 132 has a planar surface s13 and a surface s14.

The planar surface s12 of the lens portion 131 is substantially coplanar with the planar surface s13 of the body 132. The planar surface s12 of the lens portion 131 is substantially vertical to the surface s1 of the carrier 10. The planar surface s13 of the body 132 is substantially vertical to the surface s1 of the carrier 10. The planar surface s12 of the lens portion 13 and the planar surface s13 of the body 132 are substantially vertical to the surface s1 of the carrier 10. An angle θ1 is formed between the planar surface s13 of the body 132 and the surface s1 of the carrier 10. In some embodiments, the angle θ1 is approximately 90°. In some embodiments, the angle θ1 is 90°.

The surface s14 of the body 132 extends from the curved surface s11 of the lens portion 131 toward the carrier 10. The lens portion 131 is connected to the body 132. The lens portion 131 may include a chamfer (not denoted in FIG. 1A). Slope of the lens portion 131 and slope of the body 132 may be different. An angle θ2 is formed between the surface s14 of the body and the surface s1 of the carrier 10. The angle θ2 is less than 90°.

The surface s14 of the body 132 may include a curved surface. The surface s11 of the body may include a curved surface.

A surface roughness of the planar surface s12 of the lens portion 131 is different from a surface roughness of the curved surface s11 of the lens portion 131. The surface roughness of the planar surface s12 of the lens portion 131 is greater than the surface roughness of the curved surface s11 of the lens portion 131. A surface roughness of the planar surface s13 of the body 132 is different from a surface roughness of the surface s14 of the body 132. The surface roughness of the planar surface s13 of the body 132 is greater than the surface roughness of the surface s14 of the body 132. The surface roughness of the planar surface s12 of the lens portion 131 is substantially the same as the surface roughness of the planar surface s13 of the body 132. The surface roughness of the curved surface s11 of the lens portion 131 is substantially the same as the surface roughness of the surface s14 of the body 132.

The transparent encapsulant 13 may be transparent to light. The transparent encapsulant 13 may be transparent to light of a certain range of wavelengths. In some embodiments, the transparent encapsulant 13 is transparent to light with a wavelength of less than 570 nm. In some embodiments, the transparent encapsulant 13 is transparent to light with a wavelength of 380 to 450 nm. In some embodiments, the transparent encapsulant 13 is transparent to light with a wavelength of 450 to 475 nm. In some embodiments, the transparent encapsulant 13 is transparent to light with a wavelength of 475 to 495 nm. In some embodiments, the transparent encapsulant 13 is transparent to light with a wavelength of 495 to 570 nm. In some embodiments, the transparent encapsulant 13 is transparent to light with a wavelength of 570 to 590 nm. In some embodiments, the transparent encapsulant 13 is transparent to light with a wavelength of 590 to 620 nm. In some embodiments, the transparent encapsulant 13 is transparent to light with a wavelength of 620 to 750 nm. In some embodiments, the transparent encapsulant 13 is transparent to light with a wavelength of at least 750 nm. In most embodiments, the transparent encapsulant 13 is transparent to light with a wavelength of 780 to 1200 nm and invisible for human eyes.

The transparent encapsulant 14 is disposed on the surface s1 of the carrier 10. The transparent encapsulant 14 encapsulates the sensors 112 and 113 and the semiconductor device 114. The transparent encapsulant 14 covers the sensor 112. The transparent encapsulant 14 covers the sensor 113. The transparent encapsulant 14 may include transparent material. Light, light beams or rays may pass through the transparent encapsulant 14. In some embodiments, the transparent encapsulant 14 is transparent to light of a certain range of wavelengths. In some embodiments, the transparent encapsulant 14 may include the same material as the transparent encapsulant 13. In some embodiments, the transparent encapsulant 14 may include a material different from that of the transparent encapsulant 13.

The adhesives 151, 152 and 153 are disposed between the carrier 10 and the lid 12. The lid 12 is attached or mounted to the surface s1 of the carrier by the adhesives 151, 152 and 153. In some embodiments, the adhesives 151, 152 and 153 include opaque material. In some embodiments, the adhesive 151 includes optically reflective material. In some embodiments, the adhesive 152 includes optically reflective material. In some embodiments, the adhesive 153 includes optically reflective material.

The adhesives 151, 152 and 153 flow into spaces between the lid 12 and the transparent encapsulants 13 and 14. Specifically, the adhesive 151 with a height or thickness A1 is between the lid 12 and the planar surface s13 of the body 132. The adhesive 152 with a height or thickness A2 is between the lid 12 and the surface s14 of the body 132. The adhesive 153 with a height or thickness A3 is between the lid 12 and the transparent encapsulant 14. A1 is substantially less than A2. A2 is substantially the same as A3. A1 is substantially less than A3.

Figure 1B:
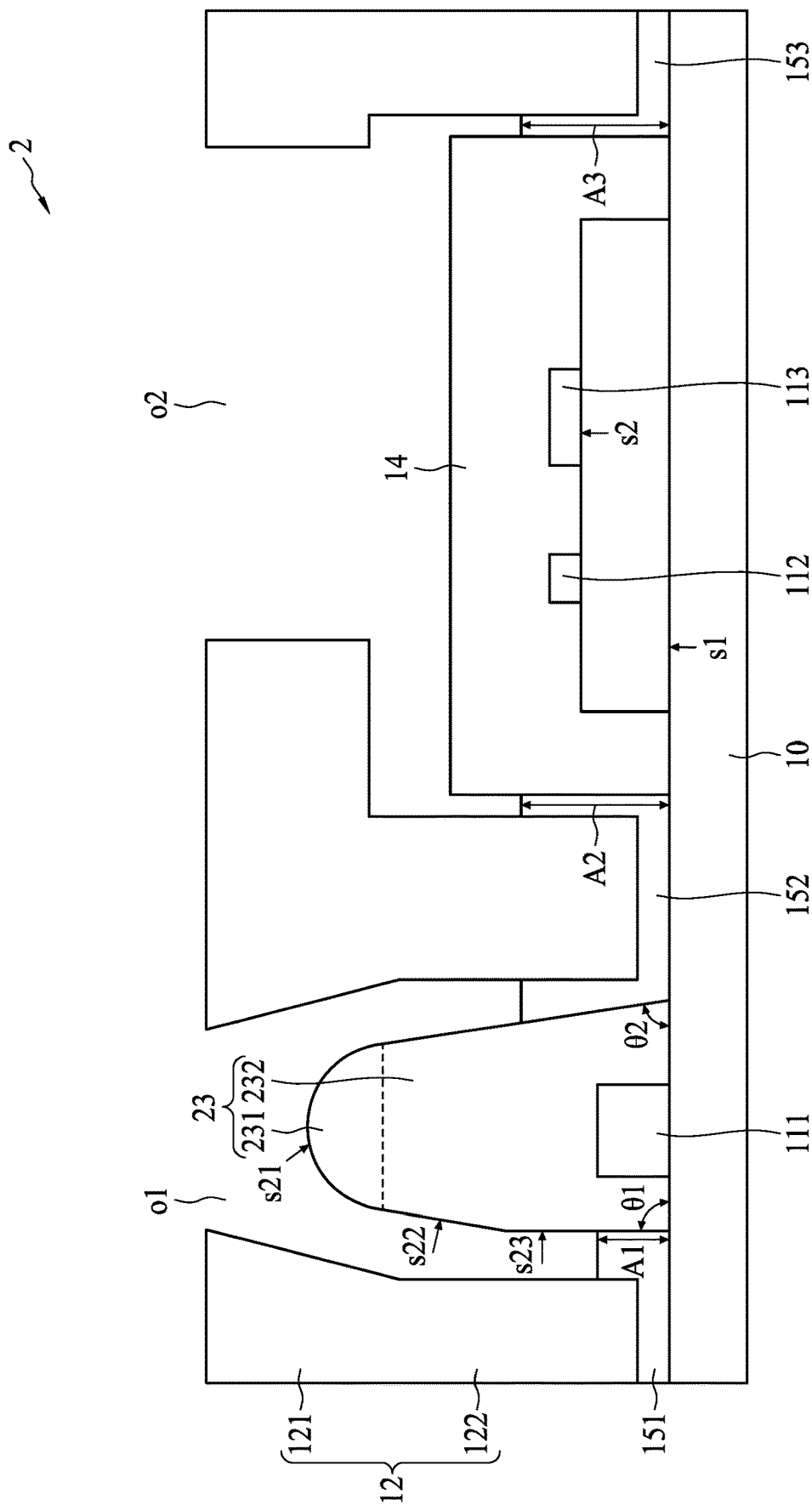
FIG. 1B illustrates a cross-sectional view of a semiconductor device package in accordance with some embodiments of the subject application.

FIG. 1B illustrates a cross-sectional view of a semiconductor device package 2 in accordance with some embodiments of the subject application. The semiconductor device package 2 is similar to the semiconductor device package 1 illustrated and described with reference to FIG. 1A, except that the transparent encapsulants 13 of the semiconductor device package 1 is replaced by the transparent encapsulant 23 of the semiconductor device package 2.

The transparent encapsulant 23 has a lens portion 231 and a body 232. The body 232 is disposed on the surface s1 of the carrier 10. The lens portion 231 is on the body 232.

The lens portion 231 has a curved surface s21. The body 232 has a surface s22 and a planar surface s23. The planar surface s23 of the body 232 is substantially vertical to the surface s1 of the carrier 10. The angle θ1 is between the planar surface s23 of the body 232 and the surface s1 of the carrier 10. In some embodiments, the angle θ1 is approximately 90°. The surface s22 of the body 232 extends from the curved surface s21 of the lens portion 231 toward the carrier 10. The planar surface s23 extends from the surface s22 of the body 232 toward the carrier 10. In some embodiments, the lens portion 231 is connected to the body 232.

The body 232 has a chamfer (not denoted in FIG. 1B). The angle θ2 is between the surface s22 of the body 232 and the surface s1 of the carrier 10. In some embodiments, the angle θ2 is less than 90°.

Surface s21 of the lens portion 231 may include a curved surface. Surface s22 of the body 232 may include a curved surface.

A surface roughness of the curved surface s21 of the lens portion 231 is substantially the same as a surface roughness of the surface s22 of the body. A surface roughness of the planar surface s23 of the body 232 is different from the surface roughness of the surface s22 of the body 232. The surface roughness of the planar surface s23 of the body 232 is different from the surface roughness of the curved surface s21 of the lens portion 231. The surface roughness of the planar surface s23 of the body 232 is greater than the surface roughness of the surface s22 of the body 232. The surface roughness of the planar surface s13 of the body 232 is greater than the surface roughness of the curved surface s21 of the lens portion 231.

The transparent encapsulant 23 may be transparent to light of a certain range of wavelengths. In some embodiments, the transparent encapsulant 23 is transparent to light with a wavelength of less than 570 nm. In some embodiments, the transparent encapsulant 13 is transparent to light with a wavelength of 380 to 450 nm. In some embodiments, the transparent encapsulant 23 is transparent to light with a wavelength of 450 to 475 nm. In some embodiments, the transparent encapsulant 23 is transparent to light with a wavelength of 475 to 495 nm. In some embodiments, the transparent encapsulant 23 is transparent to light with a wavelength of 495 to 570 nm. In some embodiments, the transparent encapsulant 23 is transparent to light with a wavelength of 570 to 590 nm. In some embodiments, the transparent encapsulant 23 is transparent to light of a wavelength of 590 to 620 nm. In some embodiments, the transparent encapsulant 23 is transparent to light with a wavelength of 620 to 750 nm. In some embodiments, the transparent encapsulant 23 is transparent to light with a wavelength of at least 750 nm. In most embodiments, the transparent encapsulant 13 is transparent to light with a wavelength of 780 to 1200 nm and invisible for human eyes.

FIG. 2A illustrates a perspective view of a portion of the semiconductor device package 1 illustrated and described with reference to FIG. 1A.

As shown in FIG. 2A, the surface s12 of the lens portion 131 is substantially coplanar with the surface s13 of the body 132. The surface s12 of the lens portion 131 is substantially vertical to the surface s1 of the carrier 10. The planar surface s13 of the body 132 is substantially vertical to the surface s1 of the carrier 10. The planar surface s12 of the lens portion 131 and the planar surface s13 of the body 132 are substantially vertical to the surface s1 of the carrier 10. In some embodiments, the surface s14 of the body 132 may include a curved surface.

A distance between the planar surface s13 of the body 132 and the emitter 111 is smaller than a distance between the surface s14 of the body 132 and the emitter 111.

FIG. 2B illustrates a perspective view of a portion of the semiconductor device package 2 illustrated and described with reference to FIG. 1B.

As shown in FIG. 2B, the planar surface s23 of the body 232 is substantially vertical to the surface s1 of the carrier 10. The surface s22 of the body 232 extends from the curved surface s21 of the lens portion 231 toward the carrier 10. The planar surface s23 of the body 232 extends from the surface s22 of the body 232 toward the carrier 10.

The surface s21 of the body 232 may include a curved surface. A distance between the planar surface s23 of the body 232 and the emitter 111 is smaller than a distance between the surface s22 of the body 232 and the emitter 111.

Figures 3A, 3D, 3G, 3J, 3M, 3P:
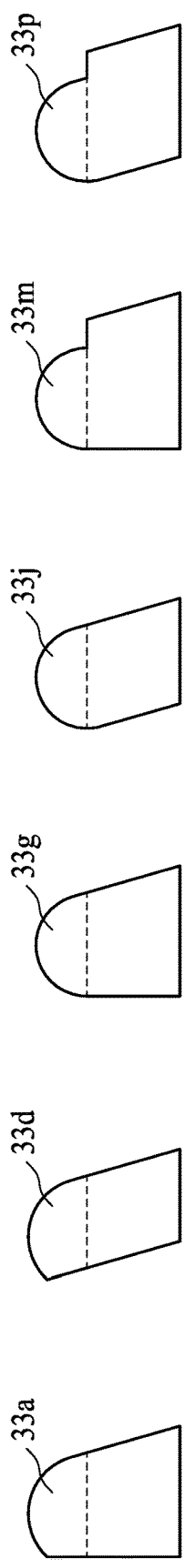
FIG. 3A illustrates a cross-sectional view of an encapsulant in accordance with some embodiments of the subject application.
FIG. 3D illustrates a cross-sectional view of an encapsulant in accordance with some embodiments of the subject application.
FIG. 3G illustrates a cross-sectional view of an encapsulant in accordance with some embodiments of the subject application.
FIG. 3J illustrates a cross-sectional view of an encapsulant in accordance with some embodiments of the subject application.
FIG. 3M illustrates a cross-sectional view of an encapsulant in accordance with some embodiments of the subject application.
FIG. 3P illustrates a cross-sectional view of an encapsulant in accordance with some embodiments of the subject application.
Figures 3B, 3E, 3H, 3K, 3N, 3Q:
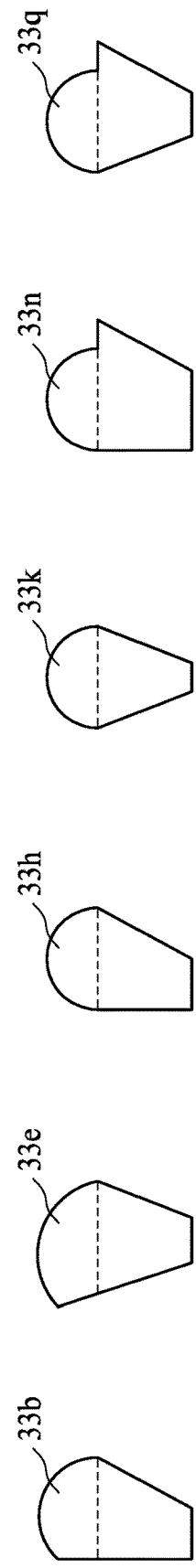
FIG. 3B illustrates a cross-sectional view of an encapsulant in accordance with some embodiments of the subject application.
FIG. 3E illustrates a cross-sectional view of an encapsulant in accordance with some embodiments of the subject application.
FIG. 3H illustrates a cross-sectional view of an encapsulant in accordance with some embodiments of the subject application.
FIG. 3K illustrates a cross-sectional view of an encapsulant in accordance with some embodiments of the subject application.
FIG. 3N illustrates a cross-sectional view of an encapsulant in accordance with some embodiments of the subject application.
FIG. 3Q illustrates a cross-sectional view of an encapsulant in accordance with some embodiments of the subject application.
Figures 3C, 3F, 3I, 3L, 3O, 3R:
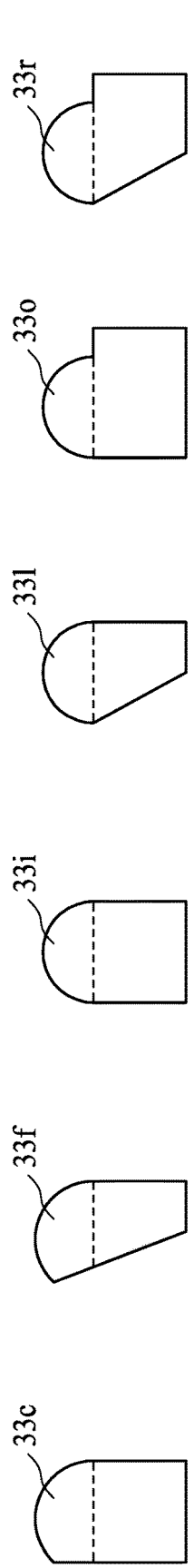
FIG. 3C illustrates a cross-sectional view of an encapsulant in accordance with some embodiments of the subject application.
FIG. 3F illustrates a cross-sectional view of an encapsulant in accordance with some embodiments of the subject application.
FIG. 3I illustrates a cross-sectional view of an encapsulant in accordance with some embodiments of the subject application.
FIG. 3L illustrates a cross-sectional view of an encapsulant in accordance with some embodiments of the subject application.
FIG. 3O illustrates a cross-sectional view of an encapsulant in accordance with some embodiments of the subject application.
FIG. 3R illustrates a cross-sectional view of an encapsulant in accordance with some embodiments of the subject application.

FIGS. 3A-3R illustrate cross-sectional views of various transparent encapsulants 33a-33r in accordance with some embodiments of the subject application.

In some embodiments, such as the embodiments that include the transparent encapsulants 33a-33f, the lens portion has a curved surface and a planar surface connected to the planar surface of the body. The body has a surface connected to the curved surface of the lens portion and a planar surface connected to the planar surface of the lens portion. The planar surface of the lens portion is substantially coplanar with the planar surface of the body.

In some embodiments, such as the embodiments that include the transparent encapsulants 33g-33l, the lens portion has a curved surface. The body has a curved surface and a surface, both of which are connected to the curved surface of the lens portion.

In some embodiments, such as the embodiments that include the transparent encapsulants 3m-3r, the lens portion has a curved surface. The body has a first planar surface, a second planar surface and a surface. The first planar surface of the body extends from the curved surface of the lens portion toward the carrier. The second planar surface of the body is connected between the curved surface of the lens portion and the surface of the body and is parallel to the surface of the carrier. The curved surface of the body extends from the second planar surface of the body toward the surface of the carrier.

In some embodiments, the angle θ1 is approximately 90°. In some embodiments, the angle θ1 is greater than 90°. In some embodiments, the angle θ2 is smaller than 90°. In some embodiments, the angle θ2 is approximately 90°. In some embodiments, the angle θ2 is greater than 90°.

Figure 4A:
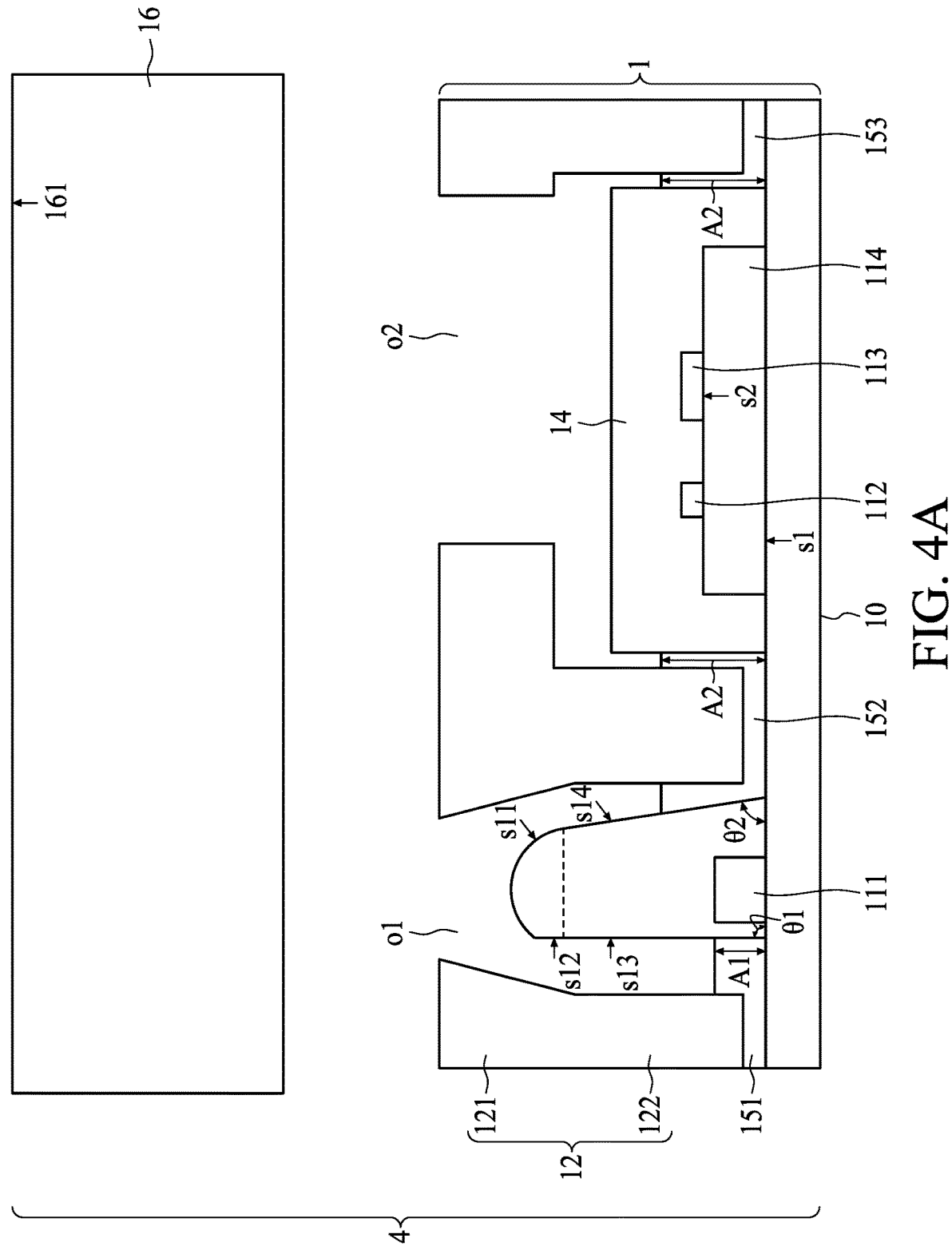
FIG. 4A illustrates a cross-sectional view of an electronic device in accordance with some embodiments of the subject application.

FIG. 4A illustrates a cross-sectional view of an electronic device 4 in accordance with some embodiments of the subject application. The electronic device 4 has the semiconductor device package 1 illustrated and described with reference to FIG. 1. 1A and a transparent plate 16.

The transparent plate 16 may be disposed over or above the semiconductor device package 1. The transparent plate 16 may include transparent material, such as glass, polymer, plastic, etc. The transparent plate 16 may be disposed on the semiconductor device package 1. The transparent plate 16 may have a substantially smooth or planar top surface 161. The transparent plate 16 may have a substantially smooth or planar bottom surface (not denoted in FIG. 4A). Incident light beams or rays on the transparent plate 16 may pass through the transparent plate 16 and the opening o2 to arrive at the sensors 112 and 113.

Figure 4B:
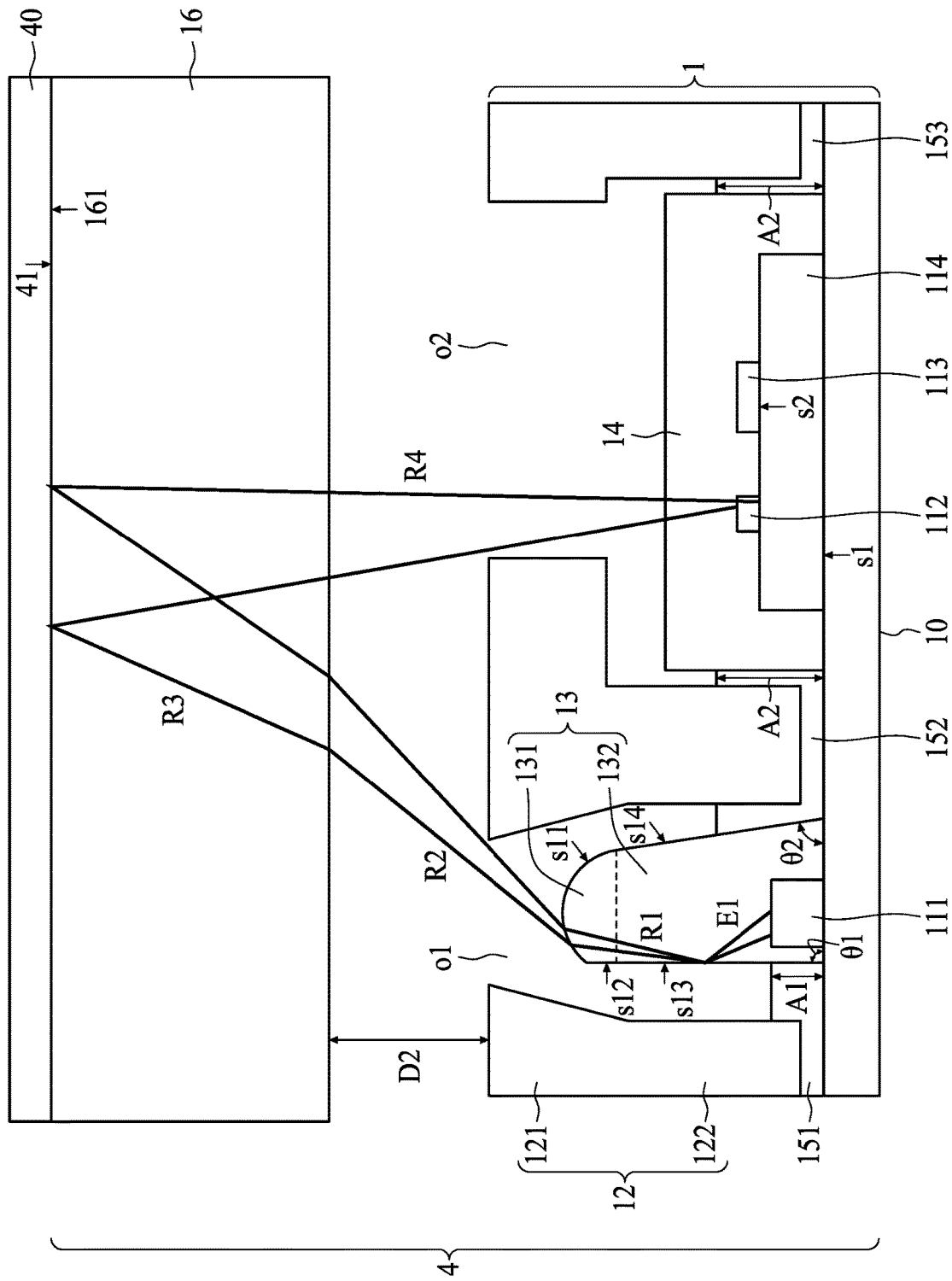
FIG. 4B illustrates light paths of an operation of an electronic device in accordance with some embodiments of the subject application.

FIG. 4B illustrates light paths of an operation of the electronic device 4 in accordance with some embodiments of the subject application.

In operation, a target 40 is placed on the transparent plate 16 of the electronic device 4. There is a distance D1 (not denoted in FIG. 4B) between the target 40 and the transparent plate 16 of the electronic device 4. In FIG. 4B, the target 40 is very close to or in contact with the transparent plate 16, so the distance D1 is almost 0. There is a distance D2 between the bottom surface (not denoted in FIG. 4B) of the transparent plate 16 and the top surface (not denoted in FIG. 4B) of the lid 12.

For example, in operation, the light beam E1 emitted from the emitter 111 may be reflected by the planar surface s13 of the body 132. The reflected light beam R1 is converged by the curved surface s11 of the lens portion 131. The reflected light beam R2 leaves the transparent encapsulant 13. The light beam R2 is refracted while entering the air. The refracted light beam R2 is refracted while entering the transparent plate 16. The refracted light beam R3 is reflected by the relatively rough surface 41 of the target 40. The reflected light beam R4 leaves the transparent plate 16 (the refraction of the light beam R4 while leaving the transparent plate 16 is not shown in FIG. 4B), enters the transparent encapsulant 14 (the refraction of the light beam R4 while entering the transparent encapsulant 14 is not shown in FIG. 4B) and arrives at the sensor 112. In brief, when the target 40 is in contact with the transparent plate 16, the sensor 112 of the semiconductor device package 4 is capable of sensing light beams emitted from the emitter 111 and reflected by the target 40.

In some embodiments, the emitter 111 is a proximity sensor, and thus the light beams received or detected by the sensor 112 may be used to determine a distance between the target 40 and the electronic device 4.

In some embodiments, the electronic device 4 is a mobile phone and the transparent plate 16 is a cover glass, and thus the semiconductor device 114 may turn off the touch screen 16 when a light beam is received or detected by the sensor 112.

In some embodiments, the electronic device 4 is a mobile phone and the transparent plate 16 is a touch screen, wherein the touch screen 16 is turned off once the sensor 112 receives or detects the light beam R4. For example, when the user is picking up the electronic device 4 to answer a phone call, his face (e.g. the target 40) may touch (or be in contact with) the touch screen 16 without triggering other operations of the electronic device 4.

Although it is not shown in FIGS. 4A and 4B, it is contemplated that when the target 40 is spaced away from the electronic device 4 or the transparent plate 16 by a distance (e.g., the distance D1 is greater than 0), light beams emitted from the emitter 111 are reflected by the surface 41 of the target 40 and arrive at the sensor 112 to determine the distance between the transparent plate 16 and the target 40.

The parameters of distances D1 and D2 are detailed in Table 1 below.

For example, if the power of signals (light beams) emitted from the emitter 111 is 1.17 mW, then the distance D1 is 0 mm, the distance D2 is 0.2 mm, the reflectance of the target 40 is 5%, and the power of signals (light beams) received by the sensor 112 is 0.40 nanowatt (nW).

In another example, if the power of signals (light beams) emitted from the emitter 111 is 1.17 mW, then the distance D1 is 30 mm, the distance D2 is 0.2 mm and reflectance of the target 40 is 26%, the power of signals (light beams) received by the sensor 112 is 0.83 nanowatt (nW).

In another example, if the power of signals (light beams) emitted from the emitter 111 is 1.17 mW, then the distance D1 is 0 mm, the distance D2 is 0.4 mm, the reflectance of the target 40 is 5%, and the power of signals (light beams) received by the sensor 112 is 0.59 nanowatt (nW).

In another example, if the power of signals (light beams) emitted from the emitter 111 is of 1.17 mW, then the distance D1 is 30 mm, the distance D2 is 0.4 mm, the reflectance of the target 40 is 26%, and the power of signals (light beams) received by the sensor 112 is 0.86 nanowatt (nW).

TABLE 1

|  | D1 = 0 mm | D1 = 30 mm |
| --- | --- | --- |
| D2 = 0.2 mm | Signal = 0.40 nW | Signal = 0.83 nW |
| D2 = 0.4 mm | Signal = 0.59 nW | Signal = 0.86 nW |

Figure 4C:
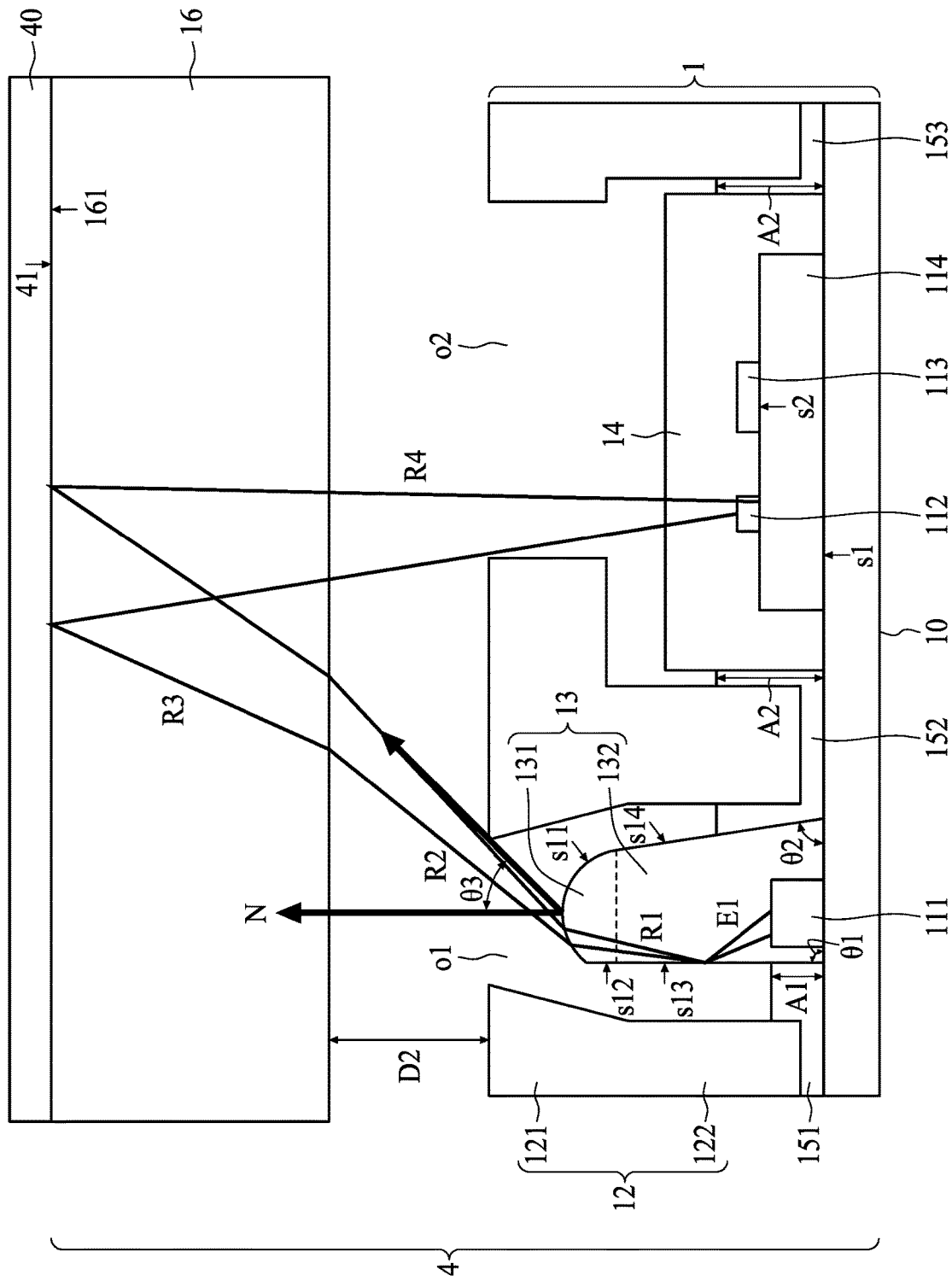
FIG. 4C illustrates light paths of an operation of an electronic device in accordance with some embodiments of the subject application.

FIG. 4C illustrates an angle θ3 of departure relatively to the lens portion 131 in accordance with some embodiments of the subject application. The angle θ3 between the light beam R2 and a normal direction N of the lens portion 131 is approximately 50°.

Figure 5A:
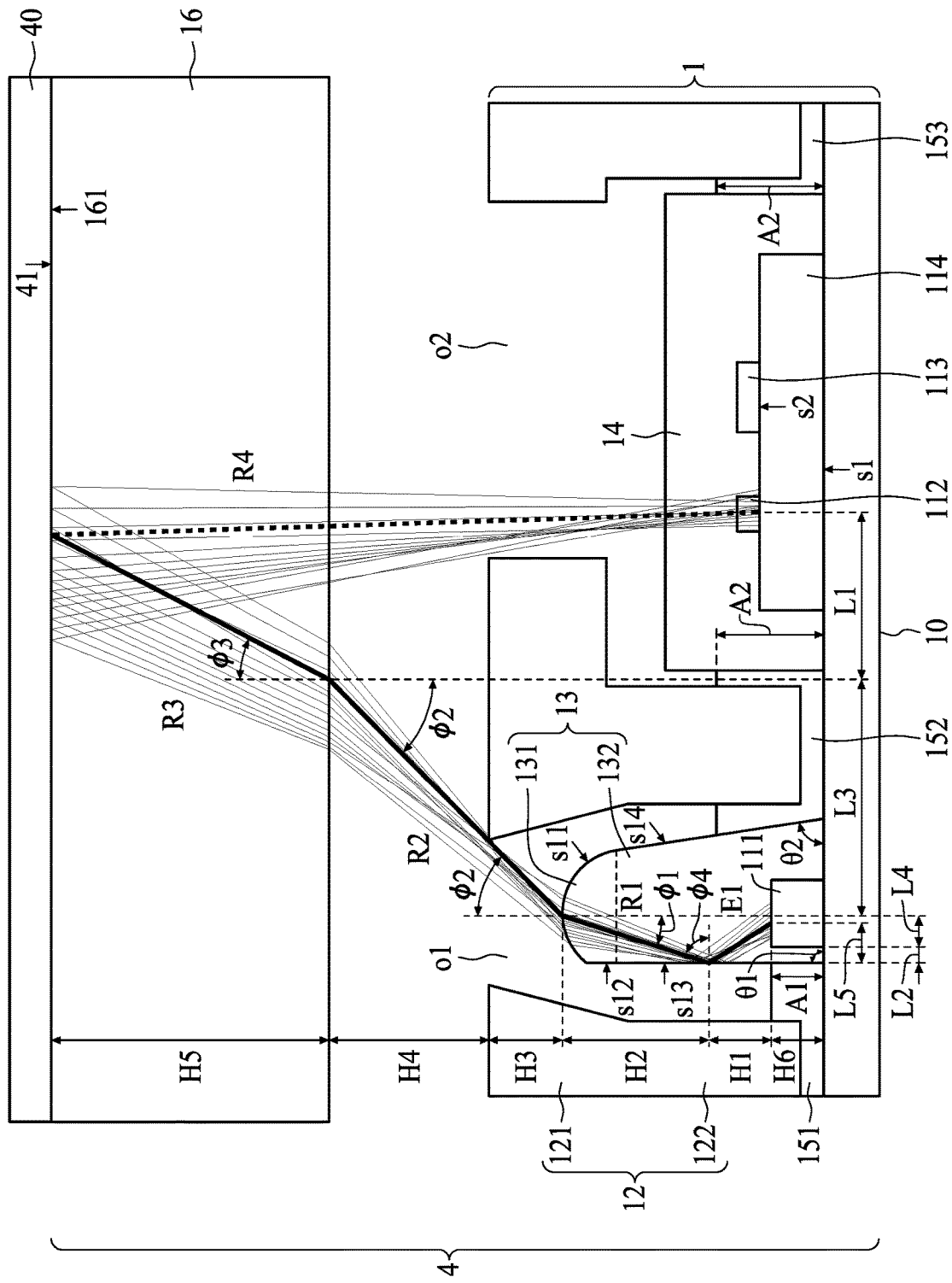
FIG. 5A illustrates light paths of an operation of an electronic device in accordance with some embodiments of the subject application.

FIG. 5A illustrates light paths of an operation of the electronic device 4 in accordance with some embodiments of the subject application.

The light beam E1 emitted from the emitter 111 may be reflected by the planar surface s13 of the body 132 with an angle of incidence φ4. The reflected light beam R1 has an angle of reflection φ4. The light beam R1 arrives at the curved surface s11 of the lens portion 131 with an angle of incidence φ1. The light beam R1 is refracted while entering the air. The refracted light beam R2 has an angle of refraction φ2. The refracted light beam R2 arrives at the transparent plate 16 with an angle of incidence of (p2. The light beam R2 is refracted while entering the transparent plate 16. The refracted light beam R3 has an angle of refraction φ3. The refracted light beam R3 is reflected by the relatively rough surface 41 of the target 40. The reflected light beam R4 leaves the transparent plate 16 (the refraction of the light beam R4 is not illustrated in FIG. 5A), enters the transparent encapsulant 14 (the refraction of the light beam R4 is not illustrated in FIG. 5A) and arrives at the sensor 112.

H1 represents a vertical/elevational distance between the level/elevation of the top surface of the emitter 111 and the level/elevation of an incident point/position on the planar surface s13 of the body 132. H2 represents a vertical/elevational distance between the level/elevation of the incident point/position on the planar surface s13 of the body 132 and the level/elevation of the top of the lens portion 131. H3 represents a vertical/elevational distance between the top of the lens portion 131 and the top of the lid 12. H4 represents an air gap/vertical distance between the top of the lid 12 and the transparent plate 16. H5 represents a thickness/height of the transparent plate 16. H6 represents a vertical/elevational distance between the level/elevation of the top surface of the emitter 111 and the level/elevation of the surface s1 of the carrier 10.

L1 represents a horizontal/lateral distance between the sensor 112 and an imaginary vertical line passing through an incidence point of the transparent plate 16. L2 represents a horizontal/lateral distance between the planar surface s13 of the body 132 and the emitter 111. L3 represents a horizontal/lateral distance between a center of the emitter 111 and an imaginary vertical line passing through an incident point of the transparent plate 16. L4 represents a horizontal/lateral distance between the center of the emitter 111 and an edge of the emitter 111 (or half of a width of the emitter 111). L5 represents a horizontal/lateral distance between an emitting point/position of the emitter 111 (from which light beam E1 is emitted) and the planar surface s13 of the body 132.

In some embodiments, the distance between the center of the emitter 111 and the center of the sensor 112 is 1 mm. Assuming that H3 is 0.15 mm, H4 is 0.4 mm and H5 is 0.7 mm. Distances H3, H4, H5, L1, and L3 meet Equations 1 and 2 as shown below:

$$(H3+H4)*\tan(\varphi 2)+H5*\tan(\varphi 3)=L1+L3=1 \quad \text{Equation 1:}$$

$$1.5*\sin(\varphi 3)=1*\sin(\varphi 2) \quad \text{Equation 2:}$$

Equation 1 shows a conversion between the lateral distances and the vertical distances. Equation 2 shows the refraction of the light beam R2 when it enters the transparent plate 16, wherein 1.5 and 1 are respectively the refractive indices of the transparent plate 16 and the air. Based on the above assumptions and equations, the angle $\varphi 2$ is approximately 47.69°. In addition, the corresponding distances L2 and L5 are respectively 0.1 mm and 0.13 mm when the angle $\varphi 2$ is 47.69°, which still meets the criterion of L5−L2>0.

Figure 5B:
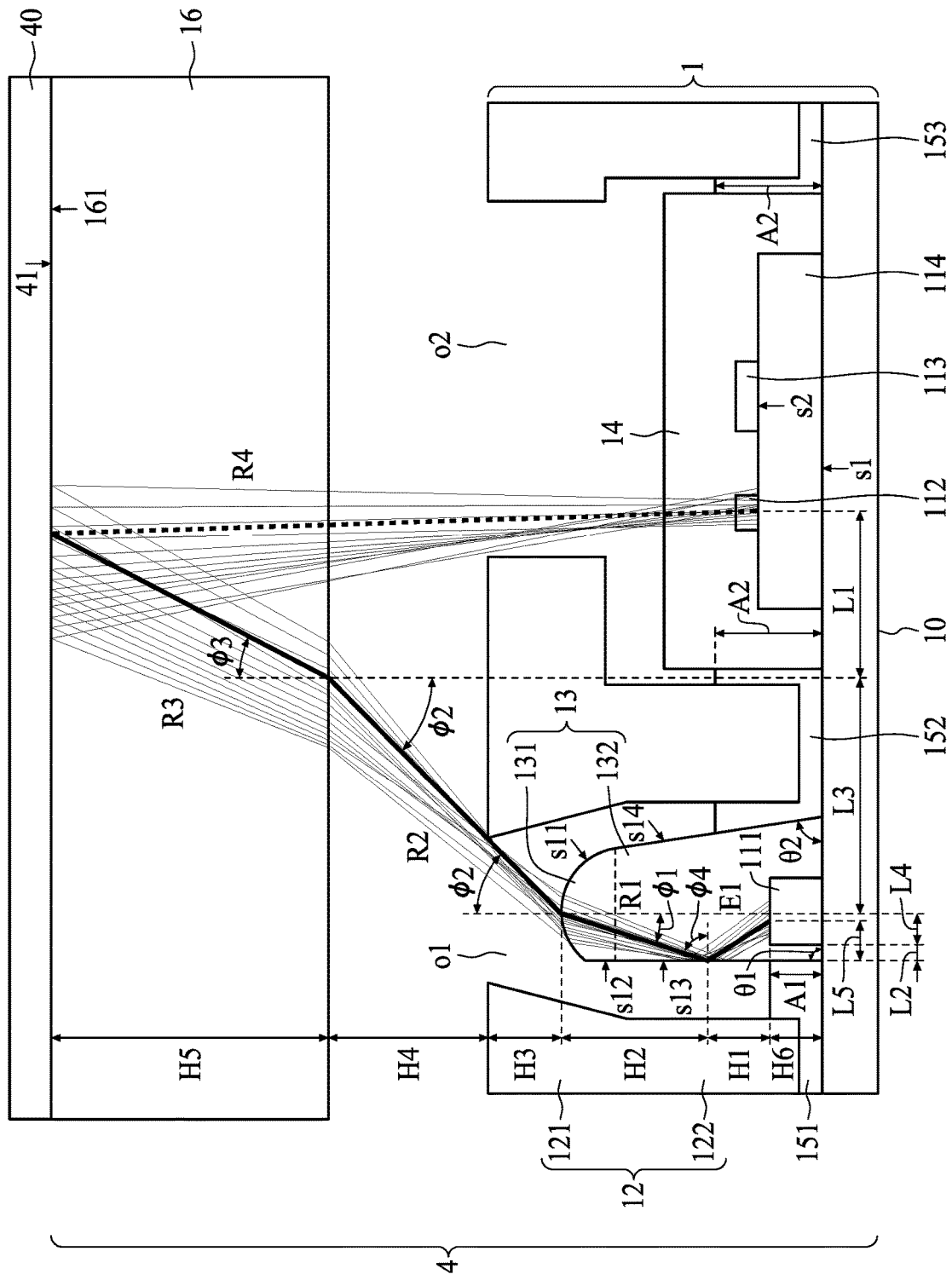
FIG. 5B illustrates light paths of an operation of an electronic device in accordance with some embodiments of the subject application.

FIG. 5B illustrates light paths of an operation of an electronic device 4 in accordance with some embodiments of the subject application.

Under the condition that L5 is greater than L2, the maximum distance L2 (or the minimum distance L5) occurs when L5 is equal to L2. To further determine the maximum value of the distance L2, Equations 3, 4 and 5 as shown below are taken into consideration.

$$1.57*\sin(\varphi 1)=1*\sin(\varphi 2) \quad \text{Equation 3:}$$

$$\varphi 1+\varphi 4=90° \quad \text{Equation 4:}$$

$$H1+H2=L2\tan(\varphi 4)+(L2+L4)*\tan(\varphi 4)=0.59 \text{ mm} \quad \text{Equation 5:}$$

Equation 3 shows the refraction when the light beam R1 is entering air, wherein 1.57 and 1 are respectively the refractive indices of the transparent encapsulant 13 and the air. Equation 4 shows that the angles $\varphi 1$ and $\varphi 4$ are complementary angles. Equation 5 shows a conversion between the lateral distances and the vertical distances. In addition, Equation 5 further assumes that the vertical/elevational distance between the level/elevation of the top surface of the emitter 111 and the level/elevation of the top of the lens portion 131 is 0.59 mm.

In some embodiments, under a condition that L4 is 0.085 mm, according to above assumptions and Equations 3, 4 and 5, the maximum L2=0.115 mm may be obtained.

The values of the power received by the sensor 112 with different distances H4 and L2 are shown in Table 2 below.

Referring to the first column in Table 2, it shows the amount of power received by the sensor 112 of the electronic device 4 when the angle θ1 of the transparent encapsulant 13 is less than 90°. In other words, the planar surface s13 of the body 132 is a leaning/tilted/sloping/inclined surface.

For example, if the power of signals (light beams) emitted from the emitter 111 of the electronic device 4 is 1.17 mW, then the distance H4 is 0.4 mm, the distance between the target 40 and the transparent plate 16 is 0 mm, the reflectance of the target 40 is 5%, and the power of signals (light beams) received by the sensor 112 of the electronic device 4 is 0.5 nanowatt (nW).

In another example, if the power of signals (light beams) emitted from the emitter 111 of the electronic device 4 is 1.17 mW, the distance H4 is 0.2 mm, a distance between the target 40 and the transparent plate 16 is 0 mm and reflectance of the target 40 is 5%, power of signal (light beams) received by the sensor 112 of the electronic device 4 is 0.30 nanowatt (nW).

Referring to the second column in Table 2, it shows the amount of power received by the sensor 112 of the electronic device 4 when the distance L2 between the planar surface s13 of the body 132 and an edge of the emitter 111 is 0.15 mm.

For example, if the power of signals (light beams) emitted from the emitter 111 of the electronic device 4 is 1.17 mW, then the distance H4 is 0.4 mm, a distance between the target 40 and the transparent plate 16 is 0 mm, the reflectance of the target 40 is 5%, and the power of signals (light beams) received by the sensor 112 of the electronic device 4 is 1.1 nanowatts (nW).

In another example, if the power of signals (light beams) emitted from the emitter 111 of the electronic device 4 is 1.17 mW, then the distance H4 is 0.2 mm, a distance between the target 40 and the transparent plate 16 is 0 mm, the reflectance of the target 40 is 5%, and the power of signals (light beams) received by the sensor 112 of the electronic device 4 is 0.30 nanowatt (nW).

Referring to the third column in Table 2, it shows the amount of power received by the sensor 112 of the electronic device 4 when the distance L2 between the planar surface s13 of the body 132 and an edge of the emitter 111 is 0.1 mm.

For example, if the power of signals (light beams) emitted from the emitter 111 of the electronic device 4 is 1.17 mW, then the distance H4 is 0.4 mm, the distance between the target 40 and the transparent plate 16 is 0 mm, the reflectance of the target 40 is 5%, and the power of signals (light beams) received by the sensor 112 of the electronic device 4 is 6.3 nanowatts (nW).

In another example, if the power of signals (light beams) emitted from the emitter 111 of the electronic device 4 is 1.17 mW, then the distance H4 is 0.2 mm, the distance between the target 40 and the transparent plate 16 is 0 mm, the reflectance of the target 40 is 5%, and the power of signals (light beams) received by the sensor 112 of the electronic device 4 is 1.7 nanowatts (nW).

Referring to the fourth column in Table 2, it shows the amount of power received by the sensor 112 of the electronic device 4 when the distance L2 between the planar surface s13 of the body 132 and an edge of the emitter 111 is 0.05 mm.

For example, if the power of signals (light beams) emitted from the emitter 111 of the electronic device 4 is 1.17 mW, then the distance H4 is 0.4 mm, the distance between the target 40 and the transparent plate 16 is 0 mm, the reflectance of the target 40 is 5%, and the power of signals (light beams) received by the sensor 112 of the electronic device 4 is 7.2 nanowatts (nW).

For another example, if the power of the signals (light beams) emitted from the emitter 111 of the electronic device 4 is 1.17 mW, then the distance H4 is 0.2 mm, the distance between the target 40 and the transparent plate 16 is 0 mm, the reflectance of the target 40 is 5%, and the power of signals (light beams) received by the sensor 112 of the electronic device 4 is 1.4 nanowatts (nW).

According to Table 2, the electronic device 4 has relatively better performance when the distance between the vertical planar surface s13 of the body 132 to the emitter 111 is smaller than 0.1 mm.

TABLE 2

|  | Tilted surface | L2 = 0.15 mm | L2 = 0.1 mm | L2 = 0.05 mm |
| --- | --- | --- | --- | --- |
| H4 = 0.4 mm | 0.5 nW | 1.1 nW | 6.3 nW | 7.2 nW |
| H4 = 0.2 mm | 0.3 nW | 0.3 nW | 1.7 nW | 1.4 nW |

Figure 6A:
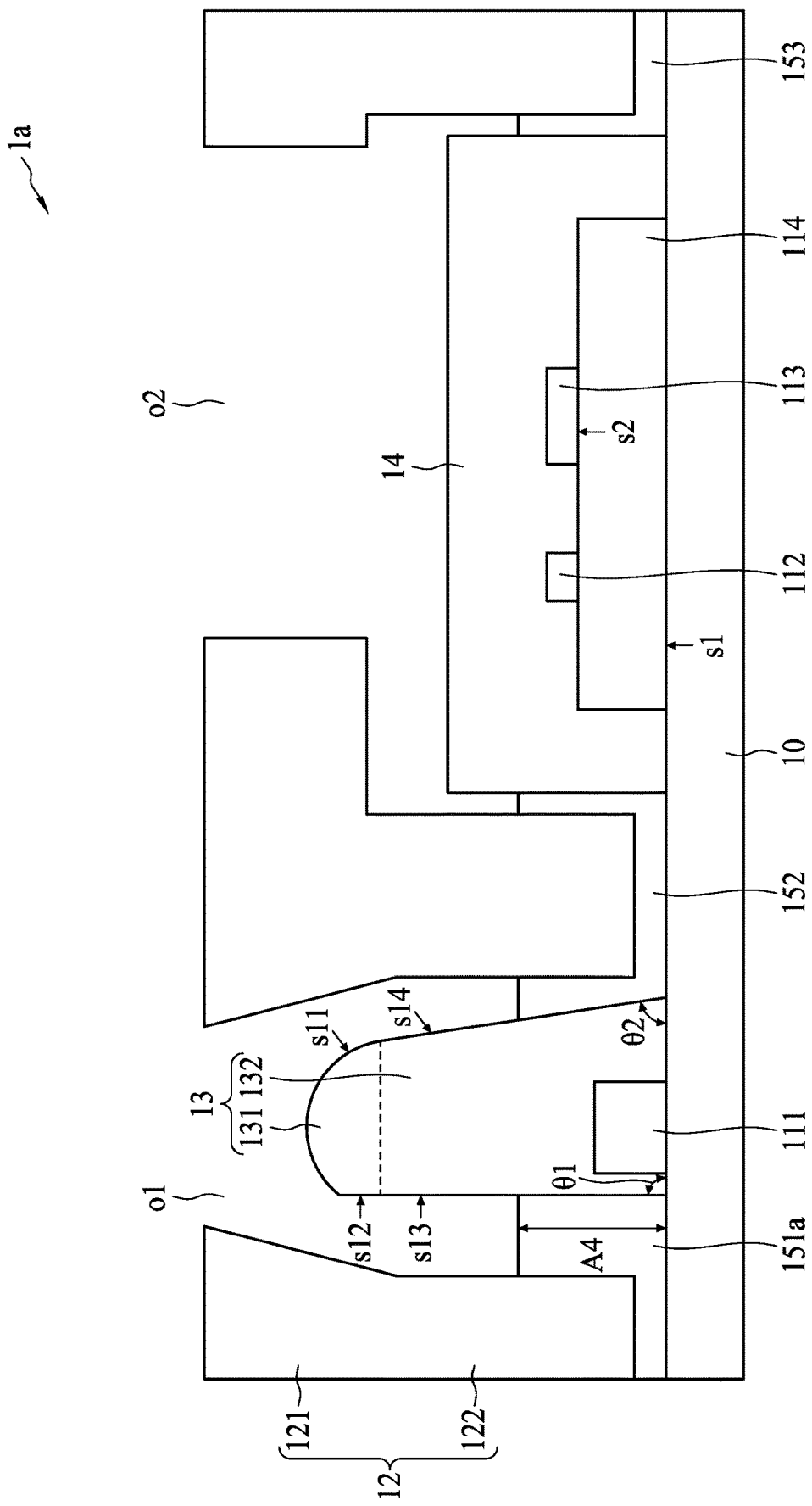
FIG. 6A illustrates a cross-sectional view of a semiconductor device package in accordance with some embodiments of the subject application.

FIG. 6A illustrates a cross-sectional view of a semiconductor device package 1a in accordance with some embodiments of the subject application. The semiconductor device package 1, which is illustrated and described with reference to FIG. 1A, is similar to the semiconductor device package 1a, except that the adhesive 151 of the semiconductor device package 1 is replaced by the adhesive 151a with a thickness or height A4 of the semiconductor device package 1a.

In some embodiments, the adhesive 151a may include opaque material. The adhesive 152 may include opaque material. The adhesive 153 may include opaque material. The adhesives 151a and 152 may surround the transparent encapsulant 13. The adhesives 152 and 153 may surround the transparent encapsulant 14.

The thickness or height A4 of the adhesive 151a which is in contact with the planar surface s13 of the body 132 is smaller than the sum of H1 and H6, where H1 represents the vertical/elevational distance between the level/elevation of the top surface of the emitter 111 and the level/elevation of incident point/position on the curved surface s11 of the lens portion 131, and H6 represents the vertical/elevational distance between the level/elevation of the top surface of the emitter 111 and the level/elevation of the surface s1 of the carrier 10. The thickness or height A4 of the adhesive 151a which is adjacent to the planar surface s13 of the body 132 is smaller than the sum of H1 and H6. The thickness or height A4 of the adhesive layer 151a which surrounds the planar surface s13 of the body 132 is smaller than the sum of H1 and H6.

In some embodiments, the adhesive 151a may include optically reflective material. The adhesive 152 may include opaque material. The adhesive 152 may include optically reflective material. The adhesive 153 may include opaque material. The adhesive 153 may include optically reflective material. The adhesives 151a and 152 may surround the transparent encapsulant 13. The adhesives 152 and 153 may surround the transparent encapsulant 14.

The thickness or height A4 of the adhesive 151a which is in contact with the planar surface s13 of the body 132 is the same as the sum of H1 and H6, where H1 represents the vertical/elevational distance between the level/elevation of the top surface of the emitter 111 and the level/elevation of incident point/position on the curved surface s11 of the lens portion 131, and H6 represents the vertical/elevational distance between the level/elevation of the top surface of the emitter 111 and the level/elevation of the surface s1 of the carrier 10. The thickness or height A4 of the adhesive 151a which is adjacent to the planar surface s13 of the body 132 is the same as the sum of H1 and H6. The thickness or height A4 of the adhesive layer 151a which surrounds the planar surface s13 of the body 132 is the same as the sum of H1 and H6.

In some embodiments, the adhesive 151a may include optically reflective material. The adhesive 152 may include opaque material. The adhesive 152 may include optically reflective material. The adhesive 153 may include opaque material. The adhesive 153 may include optically reflective material. The adhesives 151a and 152 may surround the transparent encapsulant 13. The adhesives 152 and 153 may surround the transparent encapsulant 14.

The thickness or height A4 of the adhesive 151a which is in contact with the planar surface s13 of the body 132 is greater than the sum of H1 and H6, where H1 represents the vertical/elevational distance between the level/elevation of the top surface of the emitter 111 and the level/elevation of incident point/position on the curved surface s11 of the lens portion 131, and H6 represents the vertical/elevational distance between the level/elevation of the top surface of the emitter 111 and the level/elevation of the surface s1 of the carrier 10. The thickness or height A4 of the adhesive 151a which is adjacent to the planar surface s13 of the body 132 is greater than the sum of H1 and H6. The thickness or height A4 of the adhesive layer 151a which surrounds the planar surface s13 of the body 132 is greater than the sum of H1 and H6.

Figure 6B:
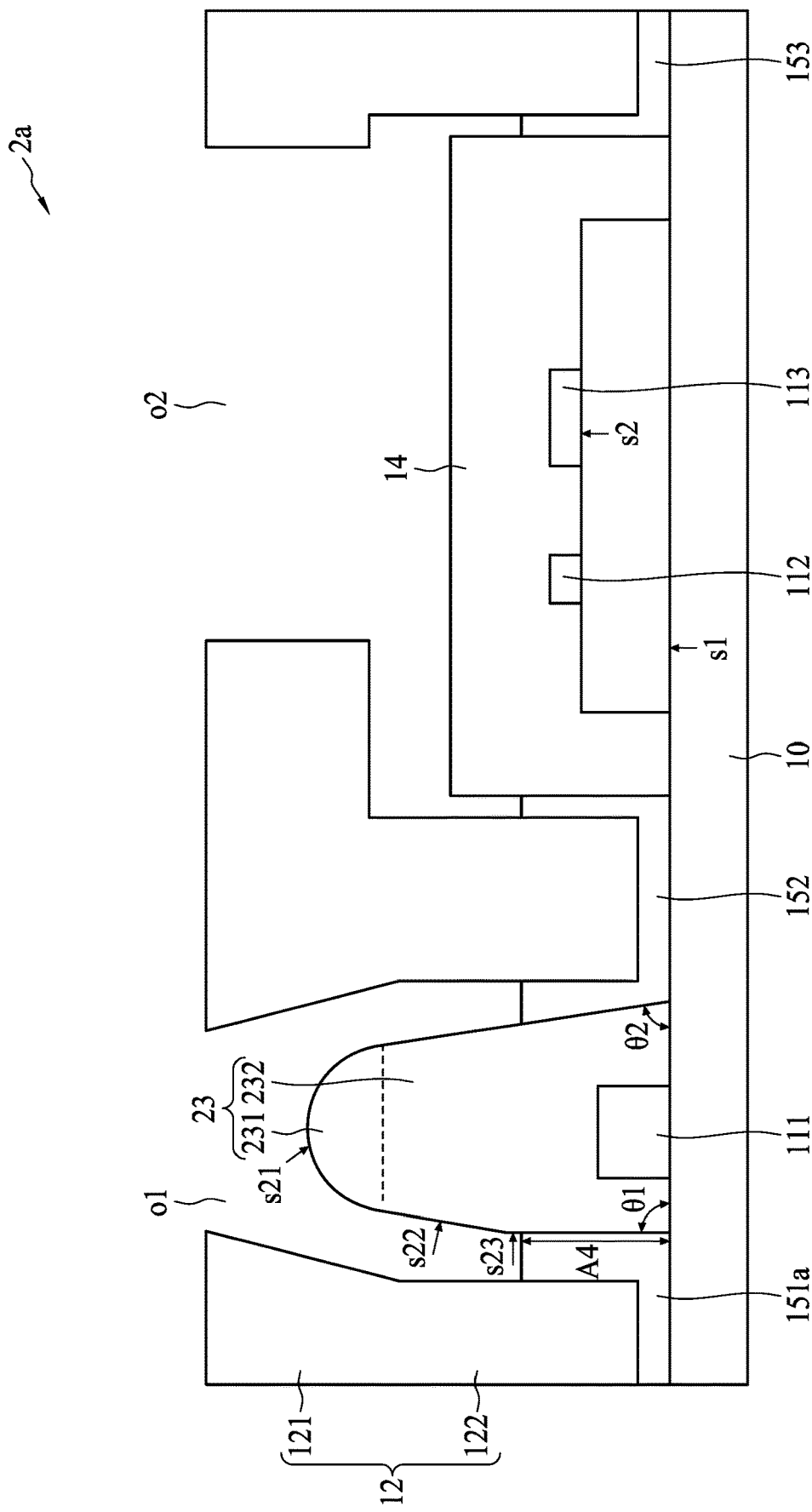
FIG. 6B illustrates a cross-sectional view of a semiconductor device package in accordance with some embodiments of the subject application.

FIG. 6B illustrates a cross-sectional view of a semiconductor device package 2a in accordance with some embodiments of the subject application. The semiconductor device package 2, which is illustrated and described with reference to FIG. 2A, is similar to the semiconductor device package 2a, except that the adhesive 151 of the semiconductor device package 2 is replaced by the adhesive 151a of the semiconductor device package 2a.

In some embodiments, the adhesive 151a may include opaque material. The adhesive 152 may include opaque material. The adhesive 153 may include opaque material. The adhesives 151a and 152 may surround the transparent encapsulant 23. The adhesives 152 and 153 may surround the transparent encapsulant 14.

The thickness or height A4 of the adhesive 151a which is in contact with the planar surface s23 of the body 232 is smaller than the sum of H1 and H6, where H1 represents the vertical/elevational distance between the level/elevation of the top surface of the emitter 111 and the level/elevation of incident point/position on the curved surface s21 of the lens portion 231, and H6 represents the vertical/elevational distance between the level/elevation of the top surface of the emitter 111 and the level/elevation of the surface s1 of the carrier 10. The thickness or height A4 of the adhesive 151a which is adjacent to the planar surface s23 of the body 232 is smaller than the sum of H1 and H6. The thickness or height A4 of the adhesive layer 151a which surrounds the planar surface s23 of the body 232 is smaller than the sum of H1 and H6.

In some embodiments, the adhesive 151a may include optically reflective material. The adhesive 152 may include opaque material. The adhesive 152 may include optically reflective material. The adhesive 153 may include opaque material. The adhesive 153 may include optically reflective material. The adhesives 151a and 152 may surround the transparent encapsulant 23. The adhesives 152 and 153 may surround the transparent encapsulant 14.

The thickness or height A4 of the adhesive 151a which is in contact with the planar surface s23 of the body 232 is the same as the sum of H1 and H6, where H1 represents the vertical/elevational distance between the level/elevation of the top surface of the emitter 111 and the level/elevation of incident point/position on the curved surface s21 of the lens portion 231, and H6 represents the vertical/elevational distance between the level/elevation of the top surface of the emitter 111 and the level/elevation of the surface s1 of the carrier 10. The thickness or height A4 of the adhesive 151a which is adjacent to the planar surface s23 of the body 232 is the same as the sum of H1 and H6. The thickness or height A4 of the adhesive layer 151a which surrounds the planar surface s23 of the body 232 is the same as the sum of H1 and H6.

In some embodiments, the adhesive 151a may include optically reflective material. The adhesive 152 may include opaque material. The adhesive 152 may include optically reflective material. The adhesive 153 may include opaque material. The adhesive 153 may include optically reflective material. The adhesives 151a and 152 may surround the transparent encapsulant 23. The adhesives 152 and 153 may surround the transparent encapsulant 14.

The thickness or height A4 of the adhesive 151a which is in contact with the planar surface s23 of the body 232 is greater than the sum of H1 and H6, where H1 represents the vertical/elevational distance between the level/elevation of the top surface of the emitter 111 and the level/elevation of incident point/position on the curved surface s21 of the lens portion 231, and H6 represents the vertical/elevational distance between the level/elevation of the top surface of the emitter 111 and the level/elevation of the surface s1 of the carrier 10. The thickness or height A4 of the adhesive 151a which is adjacent to the planar surface s23 of the body 232 is greater than the sum of H1 and H6. The thickness or height A4 of the adhesive layer 151a which surrounds the planar surface s23 of the body 232 is greater than the sum of H1 and H6.

Table 3 below shows the power received by the sensor 112 of the electronic device 4 with the adhesive 151a of different materials.

Referring to the first column in Table 3, it shows the amount of power received by the sensor 112 of the electronic device 4 when the adhesive 151 of the semiconductor device package 1 includes opaque material. The height or thickness A1 of the adhesive 151 is greater than the sum of H1 and H6.

For example, if the power of signals (light beams) emitted from the emitter 111 is 1.17 mW, then the distance D1 is 0 mm, the distance D2 (or distance H4) is 0.2 mm, the reflectance of the target 40 is 5%, and the power of signals (light beams) received by the sensor 112 is 0.08 nanowatt (nW).

For another example, if the power of signals (light beams) emitted from the emitter 111 is 1.17 mW, then the distance D1 is 0 mm, the distance D2 (or distance H4) is 0.4 mm, the reflectance of the target 40 is 26%, and the power of signals (light beams) received by the sensor 112 is 0.03 nanowatt (nW).

Referring to the second column in Table 3, it shows the amount of power received by the sensor 112 of the electronic device 4 when the adhesive 151 of the semiconductor device package 1 includes opaque material. The height or thickness A1 of the adhesive 151 is greater than the sum of H1 and H6.

For example, if the power of the signals (light beams) emitted from the emitter 111 is 1.17 mW, then the distance D1 is 30 mm, the distance D2 (or distance H4) is 0.2 mm, the reflectance of the target 40 is 5%, and the power of signals (light beams) received by the sensor 112 is 2.10 nanowatts (nW).

In another example, if the power of signals (light beams) emitted from the emitter 111 is 1.17 mW, then the distance D1 is 30 mm, the distance D2 (or distance H4) is 0.4 mm, the reflectance of the target 40 is 26%, and the power of signals (light beams) received by the sensor 112 is 2.26 nanowatts (nW).

Referring to the third column in Table 3, it shows the amount of power received by the sensor 112 of the electronic device 4 when the adhesive 151 of the semiconductor device package 1 includes optically reflective material. The height or thickness A1 of the adhesive 151 is greater than the sum of H1 and H6.

For example, if the power of signals (light beams) emitted from the emitter 111 is 1.17 mW, then the distance D1 is 0 mm, the distance D2 (or distance H4) is 0.2 mm, the reflectance of the target 40 is 5%, and the power of signals (light beams) received by the sensor 112 is 0.96 nanowatt (nW).

In another example, if the power of signals (light beams) emitted from the emitter 111 is 1.17 mW, the distance D1 is 0 mm, the distance D2 (or distance H4) is 0.4 mm, the reflectance of the target 40 is 26%, and the power of signals (light beams) received by the sensor 112 is 0.86 nanowatt (nW).

Referring to the fourth column in Table 3, it shows the amount of power received by the sensor 112 of the electronic device 4 when the adhesive 151 of the semiconductor device package 1 includes opaque material. The height or thickness A1 of the adhesive 151 is greater than the sum of H1 and H6.

For example, if the power of signals (light beams) emitted from the emitter 111 is 1.17 mW, then the distance D1 is 30 mm, then the distance D2 (or distance H4) is 0.2 mm, the reflectance of the target 40 is 5%, and the power of the signals (light beams) received by the sensor 112 is 2.10 nanowatts (nW).

For another example, if the power of signals (light beams) emitted from the emitter 111 is 1.17 mW, then the distance D1 is 30 mm, the distance D2 (or distance H4) is 0.4 mm, the reflectance of the target 40 is 26%, and the power of signals (light beams) received by the sensor 112 is 2.26 nanowatt (nW).

Referring to the fifth column in Table 3, it shows the amount of power received by the sensor 112 of the electronic device 4 when the semiconductor device package 1 does not include the adhesive 151, or the height or thickness A1 of the adhesive A1 is close to zero.

For example, if the power of signals (light beams) emitted from the emitter 111 is 1.17 mW, then the distance D1 is 0 mm, the distance D2 (or distance H4) is 0.2 mm, the reflectance of the target 40 is 5%, and the power of signals (light beams) received by the sensor 112 is 0.79 nanowatt (nW).

In another example, if the power of signals (light beams) emitted from the emitter 111 is 1.17 mW, then the distance D1 is 0 mm, the distance D2 (or distance H4) is 0.4 mm, the reflectance of the target 40 is 26%, and the power of signals (light beams) received by the sensor 112 is 0.63 nanowatt (nW).

Referring to the sixth column in Table 3, it shows the amount of power received by the sensor 112 of the electronic device 4 when the semiconductor device package 1 does not include the adhesive 151, or the height or thickness A1 of the adhesive A1 is close to zero.

For example, if the power of signals (light beams) emitted from the emitter 111 is 1.17 mW, then the distance D1 is 30 mm, the distance D2 (or distance H4) is 0.2 mm, the reflectance of the target 40 is 5%, and the power of signals (light beams) received by the sensor 112 is 2.10 nanowatts (nW).

For another example, if the power of signals (light beams) emitted from the emitter 111 is 1.17 mW, then the distance D1 is 30 mm, the distance D2 (or distance H4) is 0.4 mm, the reflectance of the target 40 is 26%, and the power of signals (light beams) received by the sensor 112 is 2.26 nanowatts (nW).

transparent encapsulant 14 is aligned to the sensor 13. The transparent encapsulants 13' and 14 may be formed through a molding process.

Figure 7A:
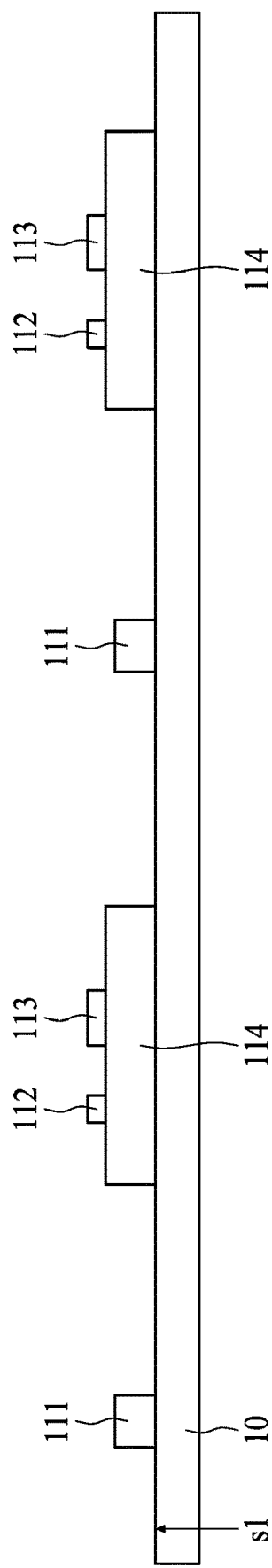
FIG. 7A, FIG. 7B, FIG. 7C, FIG. 7D and FIG. 7E are cross-sectional views of a semiconductor device package fabricated at various stages, in accordance with some embodiments of the subject application.
Figure 7B:
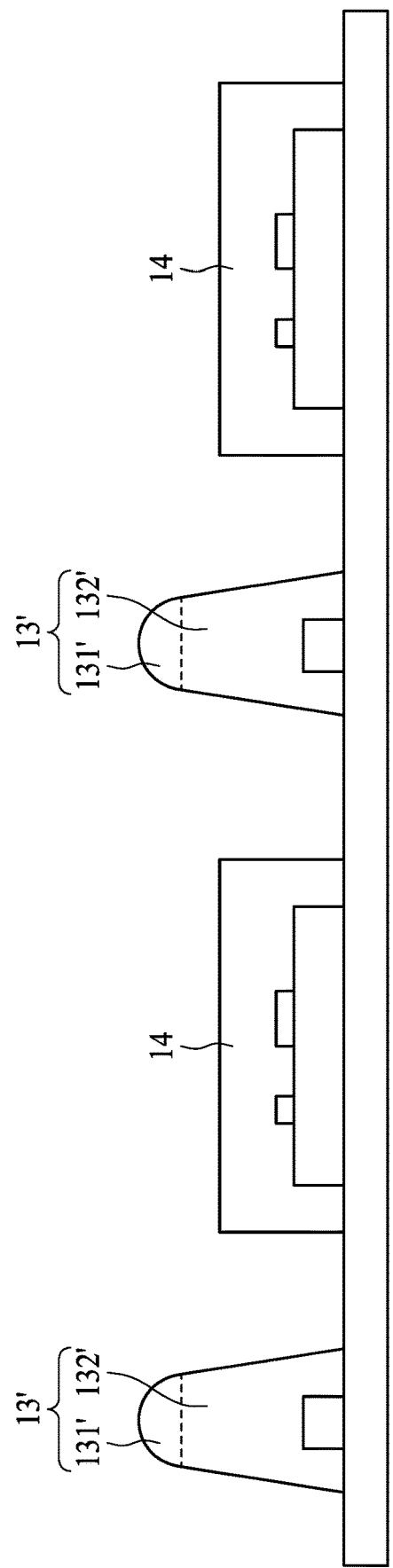
Figure 7C:
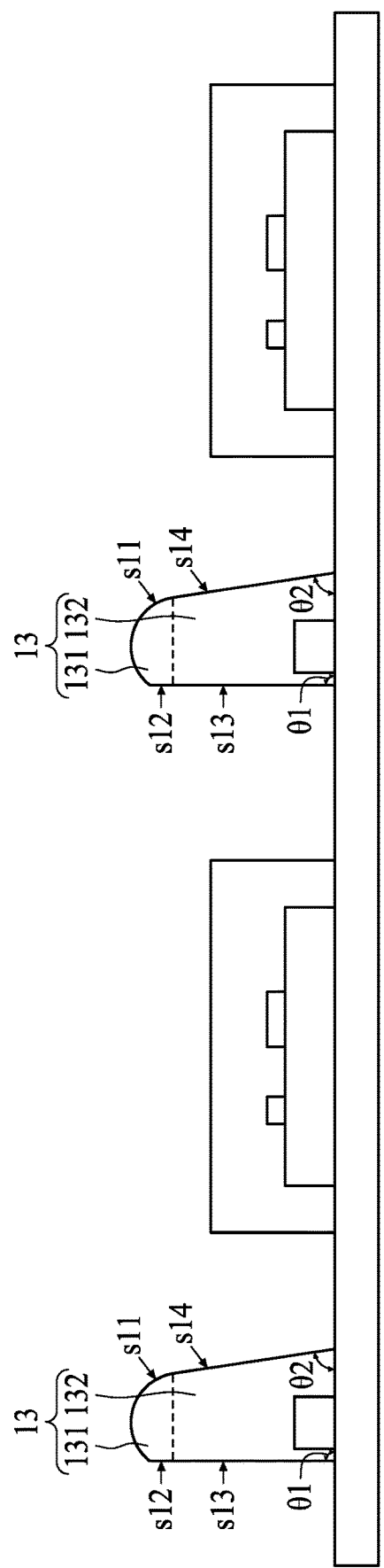

Referring to FIG. 7C, a portion of the transparent encapsulant 13' is removed to form the transparent encapsulant 13 is formed. The portion of the transparent encapsulant 13' that is relatively far from the sensors 112 and 113 is removed.

To form the transparent encapsulant 13, a cutting process may be performed on the transparent encapsulant 13'. For example, the cutting process may be a laser cutting or a mechanical cutting process. The cutting process cuts through both the lens portion 131' and the body 132' of the transparent encapulant 13'. As such, a lens portion 131 is formed. A body 132 is formed. A planar surface s12 of the lens portion 131 is formed. A planar surface s13 of the body 132 are formed.

The surface roughness of the planar surface s12 of the lens portion 131 is different from the surface roughness of the curved surface s11 of the lens portion 131. The surface roughness of the planar surface s12 of the lens portion 131 is greater than the surface roughness of the curved surface s11 of the lens portion 131. The surface roughness of the planar surface s13 of the body 132 is different from the

TABLE 3

|  | Opaque Material | | Optically Reflective Material | | No Adhesive | |
| --- | --- | --- | --- | --- | --- | --- |
|  | D1 = 0 mm | D1 = 30 mm | D1 = 0 mm | D1 = 30 mm | D1 = 0 mm | D1 = 30 mm |
| D2 = 0.2 mm | 0.08 | 2.10 | 0.96 | 2.10 | 0.79 | 2.10 |
| D2 = 0.4 mm | 0.03 | 2.26 | 0.86 | 2.26 | 0.63 | 2.26 |

FIGS. 7A, 7B, 7C, 7D and 7E are cross-sectional views of a semiconductor device package 1 fabricated at various stages in accordance with some embodiments of the subject application. Various figures have been simplified for a better understanding of the aspects of the subject application.

Referring to FIG. 7A, a carrier 10 is provided. The carrier 10 includes a silicon carbide (SiC) substrate, a sapphire substrate or a silicon substrate. Emitters 111 and semiconductor devices 114 are disposed on a surface s1 of the carrier 10. Sensors 112 and 113 are disposed on a surface s2 of a semiconductor device 114. The semiconductor device is placed adjacent to the emitter 111. The sensor 112 is placed relatively close to the emitter 111 compared to the sensor 113 on the surface s2 of the semiconductor device 114.

Referring to FIG. 7B, transparent encapsulants 13' and 14 are formed on the surface s1 of the carrier 10. The transparent encapsulant 13' covers the emitters 111. The transparent encapsulant 13' encapsulates the emitters 111. The transparent encapsulant 14 covers the sensor 112 and 113 and the semiconductor device 114. The transparent encapsulant 14 encapsulates the sensor 112 and 113 and the semiconductor device 114.

The transparent encapsulant 13' includes a lens portion 131' and a body 132'. The lens portion 131' is on the body 132'. The body 132' is on the surface s1 of the carrier 10. In some embodiments, the lens portion 131' has a spherical or a parabolic surface. The lens portions 131' converges light beams which pass through it. In some embodiments, the body 132' has a conical shape. In some embodiments, the body 132' has a cylindrical shape. In some embodiments, the body 132' has a curved shape.

In some embodiments, the center of the transparent encapsulant 13 is aligned to the emitter 111. The center of the surface roughness of the surface s14 of the body 132. The surface roughness of the planar surface s13 of the body 132 is greater than the surface roughness of the surface s14 of the body 132. The surface roughness of the planar surface s12 of the lens portion 131 is the same as the surface roughness of the planar surface s13 of the body 132. The surface roughness of the curved surface s11 of the lens portion 131 is the same as the surface roughness of the surface s14 of the body 132.

In some embodiments, the cutting process may remove more than one sides of the transparent encapsulant 13'. As long as the transparent encapsulant 13 includes a planar surface relatively far to the sensor 112 after the cutting process, the transparent encapsulant 13 is within the scope of the subject application.

Figure 7D:
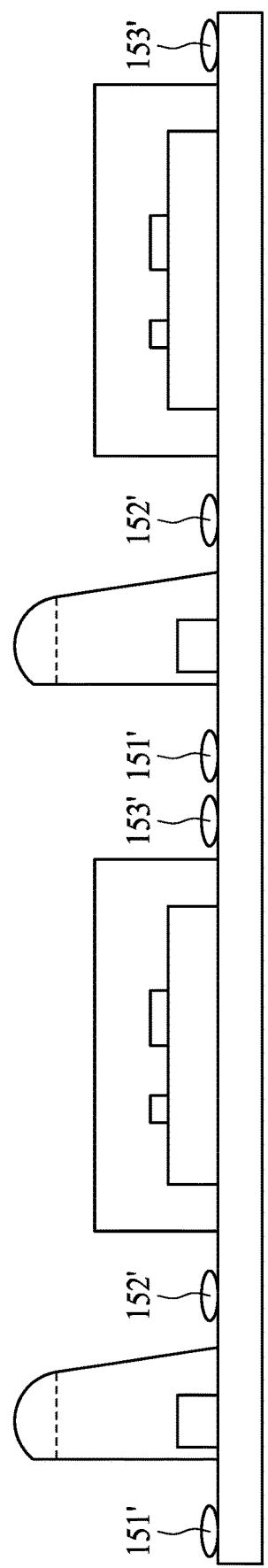

Referring to FIG. 7D, adhesives 151', 152' and 153' are disposed on the surface s1 of the carrier 10. In some embodiments, the adhesives 151', 152' and 153' may include opaque material. In some embodiments, the adhesives 151', 152' and 153' may include optically reflective material. The adhesive 151' is disposed relatively close to the planar surface s13 of the body 132. The adhesive 152' is disposed between the emitter 111 and the sensor 112. The adhesive 153' is disposed relatively close to the sensor 113.

Figure 7E:
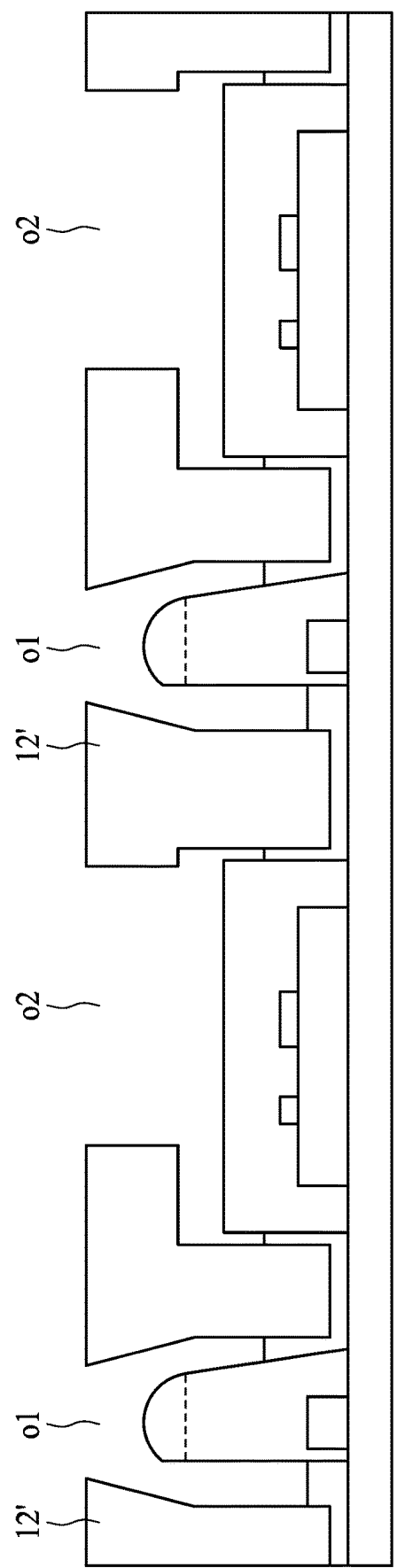

Referring to FIG. 7E, a lid 12' is disposed on the surface s1 of the carrier 10. The lid 12' may include opaque material. The lid 12' has openings o1 and o2. The center of the opening o1 is aligned to the emitter 111. The center of the opening o2 is aligned to the sensor 113. The opening o1 exposes the emitter 111, so the light beams emitted from the emitter 111 may pass through the opening o1 and arrive at a target. The opening o2 exposes the sensors 112 and 113, so the light beams reflected by the target may pass through the opening o2 and arrive at the sensors 112 and 113.

The lid 12' is mounted or attached on the surface s1 of the carrier 10 using the adhesives 151', 152' and 153'. The adhesive 151' flows into the gap or space between the lid 12' and the planar surface s13 of the body and an adhesive 151 is formed. The adhesive 152' flows into the gap or space between the lid 12' and the surface s14 of the body 132 and an adhesive 152 is formed. The adhesive 153' flows into the gap or space between the lid 12' and the transparent encapsulant 14 and an adhesive 153 is formed. The adhesive 151 has a height or thickness A1. The adhesive 152 has a height or thickness A2. The adhesive 153 has a height or thickness A3.

In some embodiments, when the adhesive 151' includes opaque material, less adhesive 151' may be disposed on the surface s1 of the carrier 10 so that the height or thickness A1 of the adhesive 151 is smaller than the sum of H1 and H6.

In some embodiments, when the adhesive 151' includes optically reflective material, less adhesive 151' may be disposed on the surface s1 of the carrier 10 so that the height or thickness A1 of the adhesive 151 is greater than the sum of H1 and H6.

In some embodiments, when the adhesive 151' includes optically reflective material, more adhesive 151' may be disposed on the surface s1 of the carrier 10 so that the height or thickness A1 of the adhesive 151 is greater than the sum of H1 and H6.

A singulation operation may be performed to form the semiconductor device package 1 illustrated and described with reference to FIG. 1A.

FIGS. 8A, 8B, 8C, 8D and 8E are cross-sectional views of a semiconductor device package 2 fabricated at various stages in accordance with some embodiments of the subject application. Various figures have been simplified for a better understanding of the aspects of the subject application.

Figure 8A:
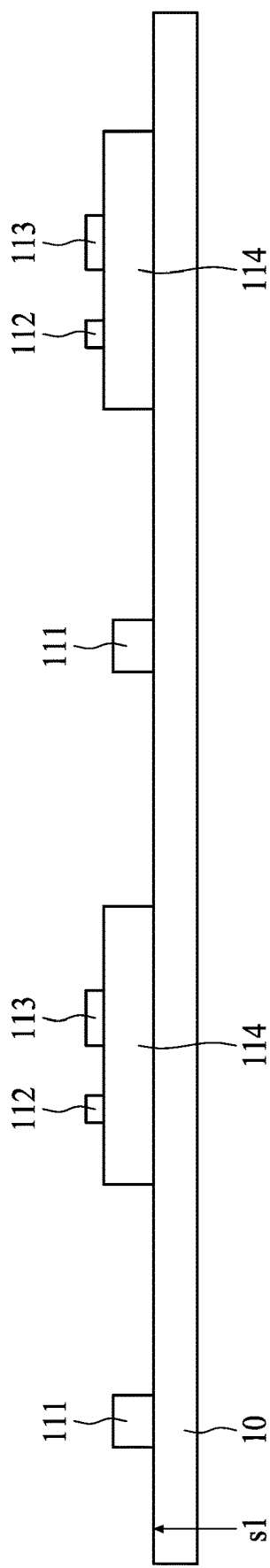
FIG. 8A, FIG. 8B, FIG. 8C, FIG. 8D and FIG. 8E are cross-sectional views of a semiconductor device package fabricated at various stages, in accordance with some embodiments of the subject application.

Referring to FIG. 8A, a carrier 10 is provided. The carrier 10 includes a silicon carbide (SiC) substrate, a sapphire substrate or a silicon substrate. An emitter 111 and a semiconductor device 114 are disposed on a surface s1 of the carrier 10. Sensors 112 and 113 are disposed on a surface s2 of the semiconductor device 114. The sensor 112 is placed between the emitter 111 and the sensor 113. In other words, the sensor 112 is placed relatively close to the emitter 111 compared to the sensor 113.

Figure 8B:
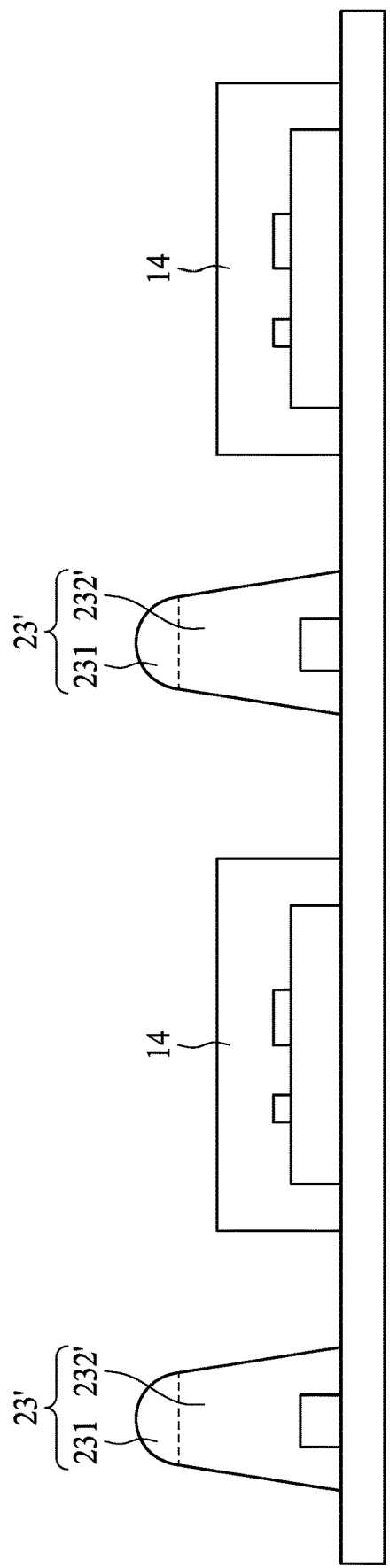

Referring to FIG. 8B, transparent encapsulants 23' and 14 are formed on the surface s1 of the carrier 10. The transparent encapsulant 23' covers the emitter 111. The transparent encapsulant 23' encapsulates the emitter 111. The transparent encapsulant 14 covers the sensor 112 and 113 and the semiconductor device 114. The transparent encapsulant 14 encapsulates the sensor 112 and 113 and the semiconductor device 114.

The transparent encapsulant 23' includes a lens portion 231 and a body 232'. The lens portion 231 is on the body 232'. The body 232' is on the surface s1 of the carrier 10. In some embodiments, the lens portion 231 has a spherical or a parabolic surface. The lens portions 231 converges light beams which pass through it. In some embodiments, the body 232' has a cylindrical shape. In some embodiments, the body 232' has a curved shape.

In some embodiments, the center of the transparent encapsulant 23' is aligned to the emitter 111. In some embodiments, the center of the transparent encapsulant 14 is aligned to the sensor 113. The transparent encapsulants 23' and 14 may be formed through a molding process.

Figure 8C:
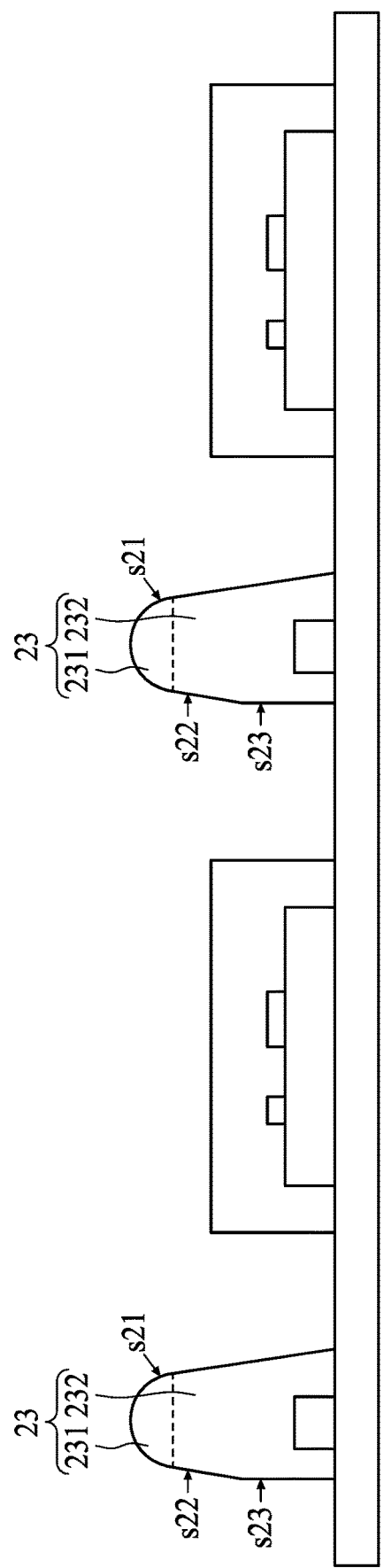

Referring to FIG. 8C, a portion of the transparent encapsulant 23' is removed and the transparent encapsulant 23 is formed. A portion of the transparent encapsulant 23' that is relatively far from the sensors 112 and 113 is removed.

To form the transparent encapsulant 23, a cutting process may be performed on the transparent encapsulants 23'. The cutting process may, for example, be a laser cutting or a mechanical cutting process. The cutting process cuts through the body 232' of the transparent encapulant 23'. As such, the body 232 is formed. A planar surface s23 of the body 232 is formed.

The surface roughness of the curved surface s21 of the lens portion 231 is the same as a surface roughness of the surface s22 of the body. The surface roughness of the planar surface s13 of the body 232 is different from the surface roughness of the surface s22 of the body 232. The surface roughness of the planar surface s13 of the body 232 is different from the surface roughness of the curved surface s21 of the lens portion 231. The surface roughness of the planar surface s13 of the body 232 is greater than the surface roughness of the surface s22 of the body 232. The surface roughness of the planar surface s13 of the body 232 is greater than the surface roughness of the curved surface s21 of the lens portion 231.

In some embodiments, the cutting process may remove more than one side of the transparent encapsulant 23'. As long as the transparent encapsulant 13 includes a planar surface relatively far to the sensor 112 after the cutting process, the transparent encapsulant 23 is within the scope of the subject application.

Figure 8D:
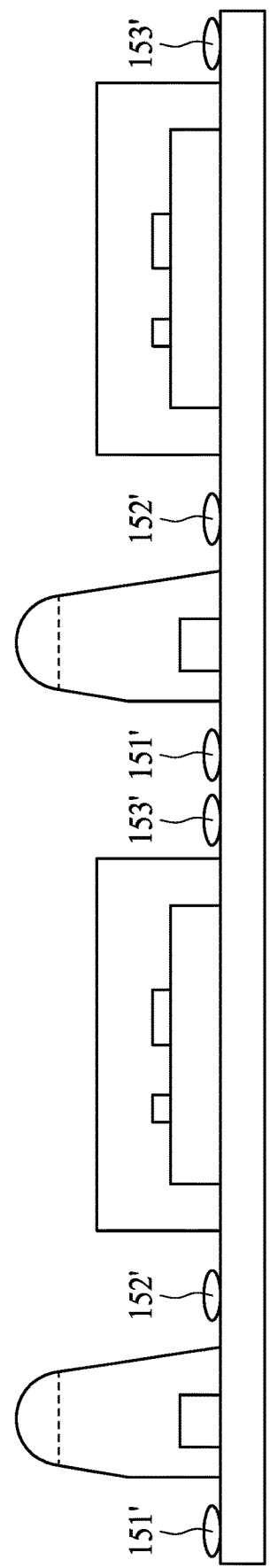

Referring to FIG. 8D, adhesives 151', 152' and 153' are disposed on the surface s1 of the carrier 10. In some embodiments, the adhesives 151', 152' and 153' may include opaque material. In some embodiments, the adhesives 151', 152' and 153' may include optically reflective material. The adhesive 151' is disposed relatively close to the planar surface s23 of the body 232. The adhesive 152' is disposed between the emitter 111 and the sensor 112. The adhesive 153' is disposed relatively close to the sensor 113.

Figure 8E:
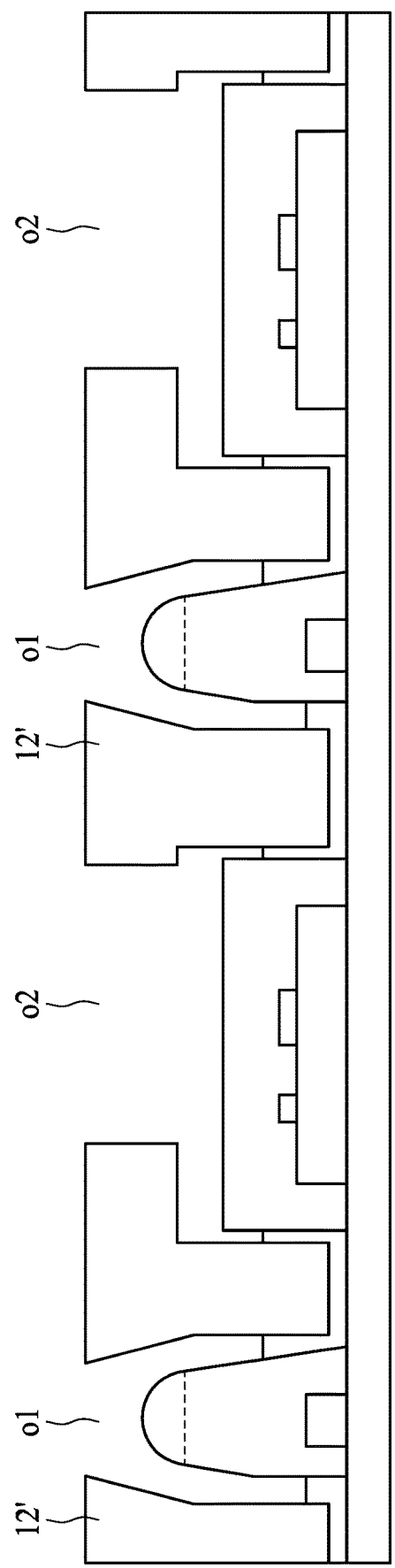

Referring to FIG. 8E, a lid 12' is disposed on the surface s1 of the carrier 10. The lid 12' may include opaque material. The lid 12' has openings o1 and o2. The center of the opening o1 is aligned to the emitter 111. The center of the openings o2 is aligned to the sensor 113. The opening o1 exposes the emitter 111, so the light beams emitted from the emitter 111 may pass through the opening o1 and arrive at a target. The opening o2 exposes the sensors 112 and 113, so the light beams reflected by the target may pass through the opening o2 and arrive at the sensors 112 and 113.

The lid 12' is mounted or attached on the surface s1 of the carrier 10 using the adhesives 151', 152' and 153'. The adhesive 151' flows into the gap or space between the lid 12' and the planar surface s23 of the body and adhesive 151 is formed. The adhesive 152' flows into the gap or space between the lid 12' and the surface s22 of the body 232 and an adhesive 152 is formed. The adhesive 153' flows into the gap or space between the lid 12' and the transparent encapsulant 14 and an adhesive 153 is formed. The adhesive 151 has a height or thickness A1. The adhesive 152 has a height or thickness A2. The adhesive 153 has a height or thickness A3.

The amount of the adhesive 151' may be determined based on the type of material contained in the adhesive 151' or the distance between the lid 12' and the planar surface s13 of the body 232.

In some embodiments, when the adhesive 151' includes opaque material, less adhesive 151' may be disposed on the surface s1 of the carrier 10 so that the height or thickness A1 of the adhesive 151 is smaller than the sum of H1 and H6.

In some embodiments, when the adhesive 151' includes optically reflective material, less adhesive 151' may be disposed on the surface s1 of the carrier 10 so that the height or thickness A1 of the adhesive 151 is greater than the sum of H1 and H6.

In some embodiments, when the adhesive 151' includes optically reflective material, more adhesive 151' may be disposed on the surface s1 of the carrier 10 so that the height or thickness A1 of the adhesive 151 is greater than the sum of H1 and H6.

In addition, a singulation operation may be performed to form the semiconductor device package 2 illustrated and described with reference to FIG. 1B.

Figure 9A:
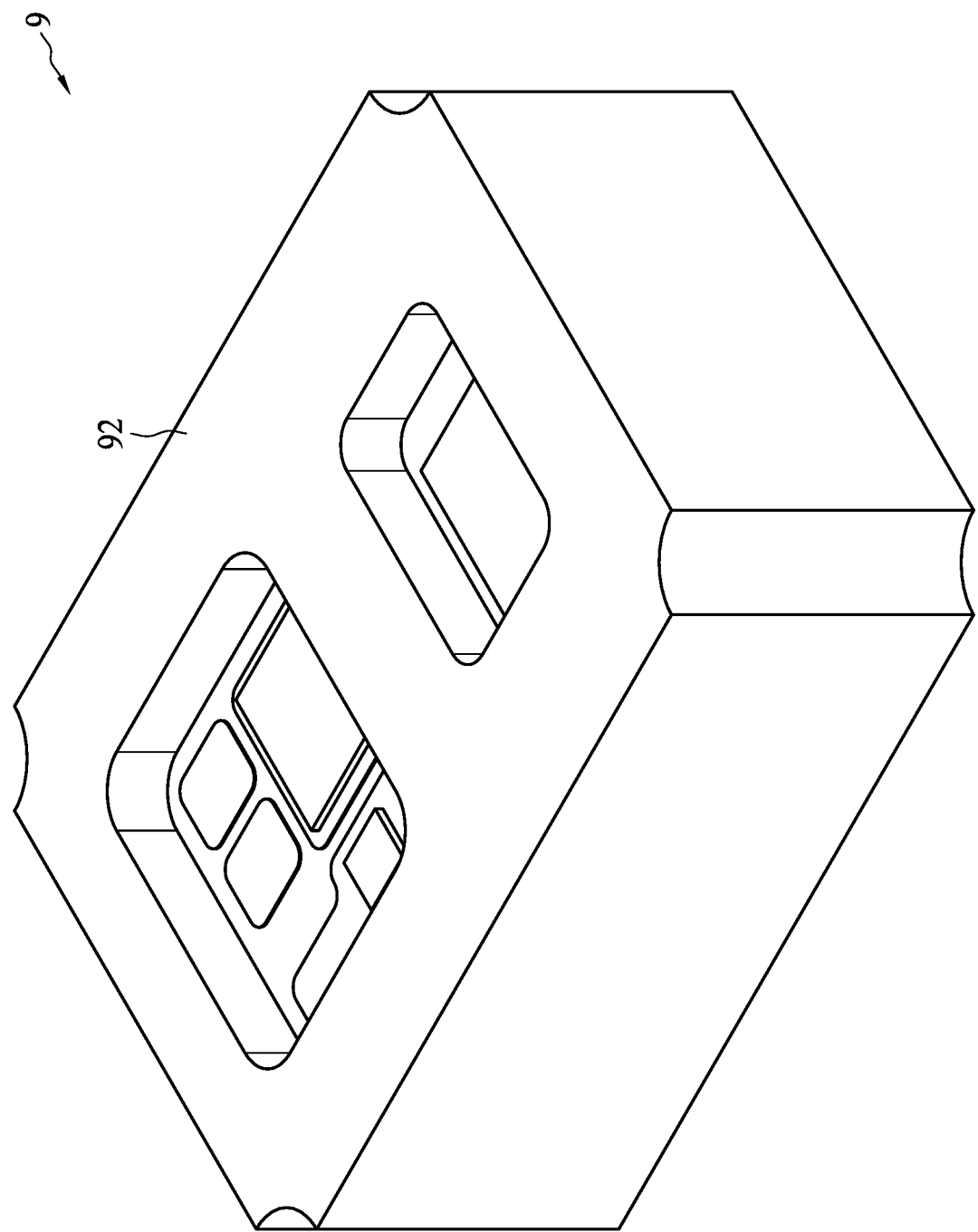
FIG. 9A illustrates a perspective view of a semiconductor device package in accordance with some embodiments of the subject application.

FIG. 9A illustrates a perspective view of a semiconductor device package 9 in accordance with some embodiments of the subject application. The semiconductor device package 9 includes a lid 92.

Figure 9B:
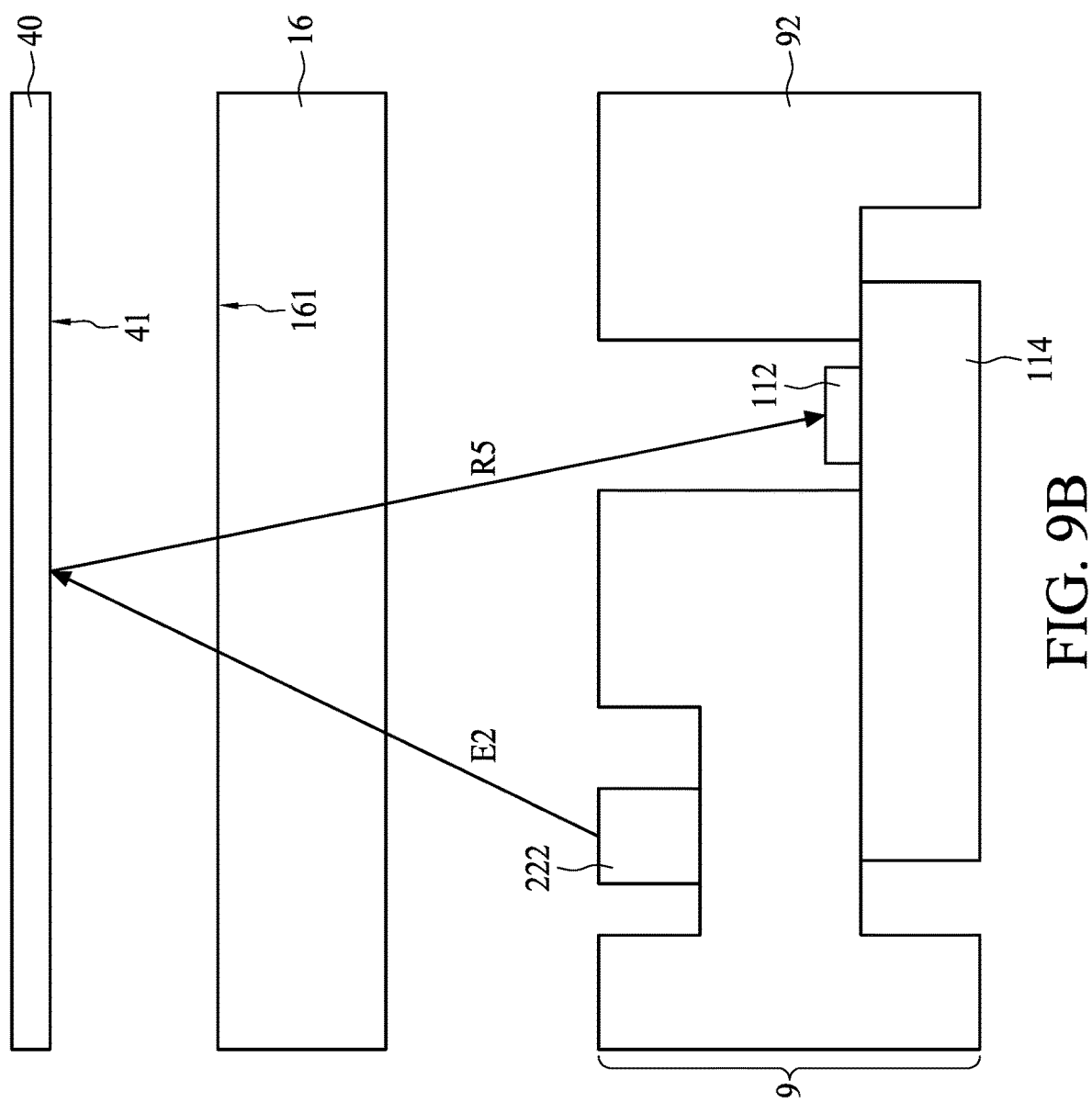
FIG. 9B illustrates light paths of an operation of the semiconductor device package shown in FIG. 9A in accordance with some embodiments of the subject application.

FIG. 9B illustrates light paths of an operation of the semiconductor device package 9 shown in FIG. 9A in accordance with some embodiments of the subject application. The semiconductor device package 9 includes a carrier (not denoted in FIG. 9B), an emitter 111, a sensor 112 and a lid 92.

The emitter 111 is disposed in a cavity) defined by the lid 92. The sensor 112 is disposed on the carrier. The lid 92 is disposed on the carrier. The lid 92 has an opening to expose the sensor 112.

A transparent plate 16 is disposed on the semiconductor device package 9. A mask layer is formed on the transparent plate 16.

A target 40 is spaced from the transparent plate 16 by a distance. The light beam E2 emitted from the semiconductor device 11 which passes through the transparent plate 16 may be reflected by a substantially rough surface 41 of the target 40. The reflected light beam R5 which passes through the transparent plate 16 and opening of the lid 92 may arrive at the sensor 112.

Figure 10A:
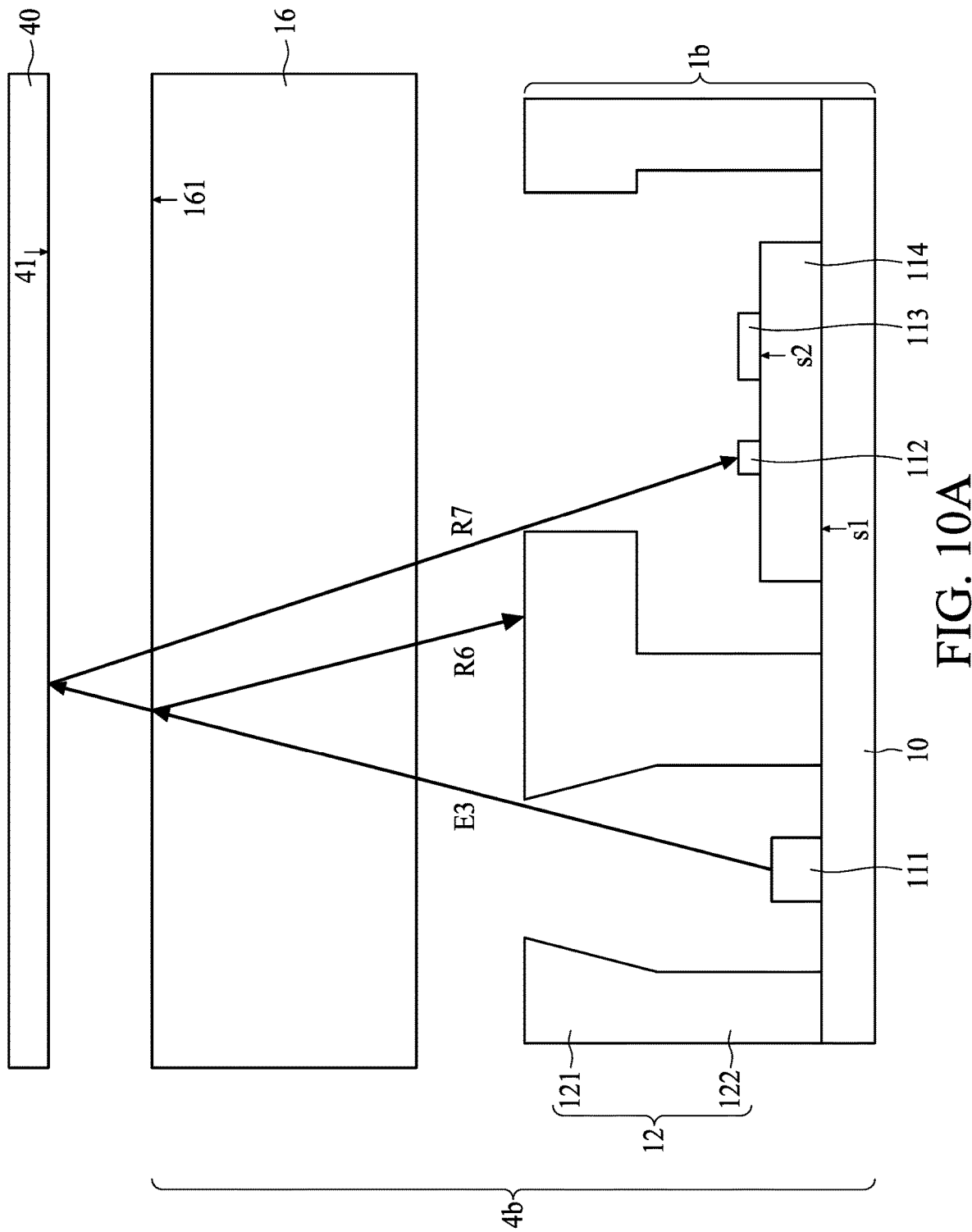
FIG. 10A illustrates light paths of an electronic device in accordance with some embodiments of the subject application.

FIG. 10A illustrates light paths of an electronic device 4b in accordance with some embodiments of the subject application. The electronic device 4b is similar to the electronic device 4 illustrated and described in FIG. 4A, except that the transparent encapsulant 13 is not included in the electronic device 4b.

In operation, a target 40, which may include a user's face, hand, finger, palm or other object(s), may be spaced from the transparent plate 16 by a distance. Light beam E3 emitted from the emitter 111 may pass through the opening of and the transparent plate 16, and arrive at a substantially rough surface 41 of the target 40.

Light beam R6 reflected by the surface 161 of the transparent plate 16 is blocked by the lid 12. Light beam R7 reflected by the surface 41 of the target 40 may pass the opening o2 of the transparent plate 16 to arrive at the sensors 112 and 113.

The lid 12 prevents the reflected light beam R6 from arriving at the sensor 112. The lid 12 prevents the reflected light beam R6 from arriving at the sensor 113. A relatively small angle of departure/emitted light beam E3 from the emitter 111 is included to prevent the reflected light beam R6 from arriving at the sensor 112. A relatively small angle of departure/emitted light beam from the emitter 111 is included to prevent the reflected light beam R6 from arriving at the sensor 113.

For example, the light beam E3 emitted from the emitter 111 may be reflected by the relatively rough surface 41, the reflected light beam R7 reflected by the surface 41 may arrive at the sensor 112. In a condition that the sensor 112 is a proximity sensor, the light beam R7 received or detected by the sensor 112 may be used to determine a distance between the target 40 and the electronic device 4b.

For example, in a condition that the electronic device 4b is a mobile phone and the transparent plate 16 is a cover glass, the semiconductor device 114 may help turning or switching off the touch screen 16 while the light beam R7 is received or detected by the sensor 112.

Figure 10B:
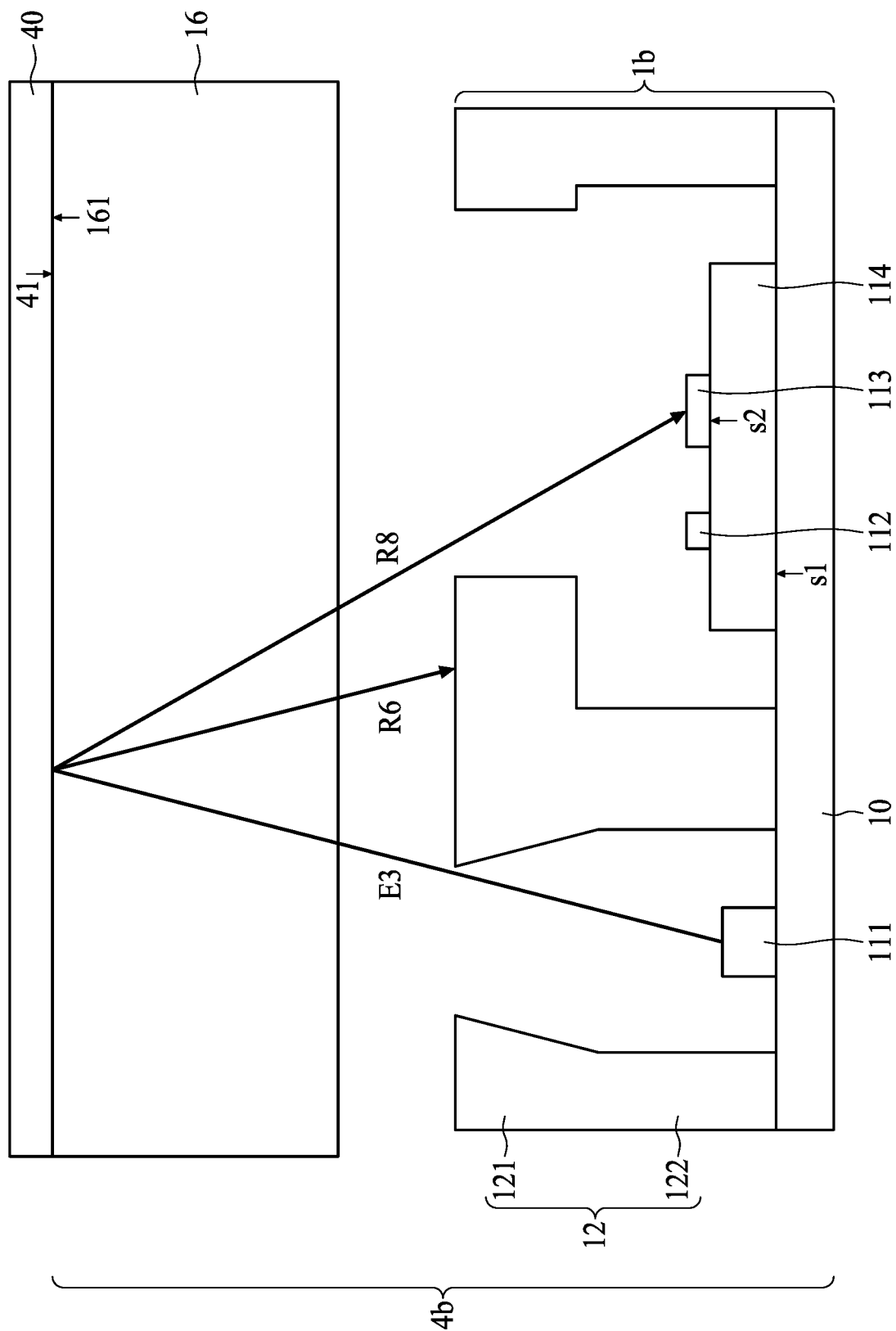
FIG. 10B illustrates light paths of an electronic device in accordance with some embodiments of the subject application.

FIG. 10B illustrates light paths of an electronic device 4b in accordance with some embodiments of the subject application. The electronic device 4b is similar to the electronic device 4 illustrated and described with reference to FIG. 4A, except that the transparent encapsulant 13 is not included in the electronic device 4b. The target 40 is placed very close to the transparent plate 16. In other words, the distance between the surface 41 of the target 40 and the surface 161 of the transparent plate 16 is almost zero.

In operation, the light beam E3 emitted from the emitter 111 passes through the opening of and arrives at the transparent plat 16. The light beam R6 reflected by the surface 161 of the transparent plate 16 is blocked by the lid 12. The light beam R8 reflected by the surface 41 of the target 40 passes through the opening o2 of the lid. However, the light beam R6 may not arrive at the sensor 112.

For example, if the sensor 112 is a proximity sensor, failure to receive or detect the light beam R6 may result in the malfunctioning of the electronic device 4b. For example, if the electronic device 4b is a mobile phone and the transparent plate 16 is a cover glass, the cover glass 16 is not turned off because the sensor 112 does not receive or detect the light beam R6. For example, when the user is picking up the electronic device 4b to answer a phone call, his face (e.g. the target 40) may touch the touch screen 16 to trigger another operation(s) of the electronic device 4b due to the failure of the sensor 112 to receive or detect the light beam R6.

Figure 10C:
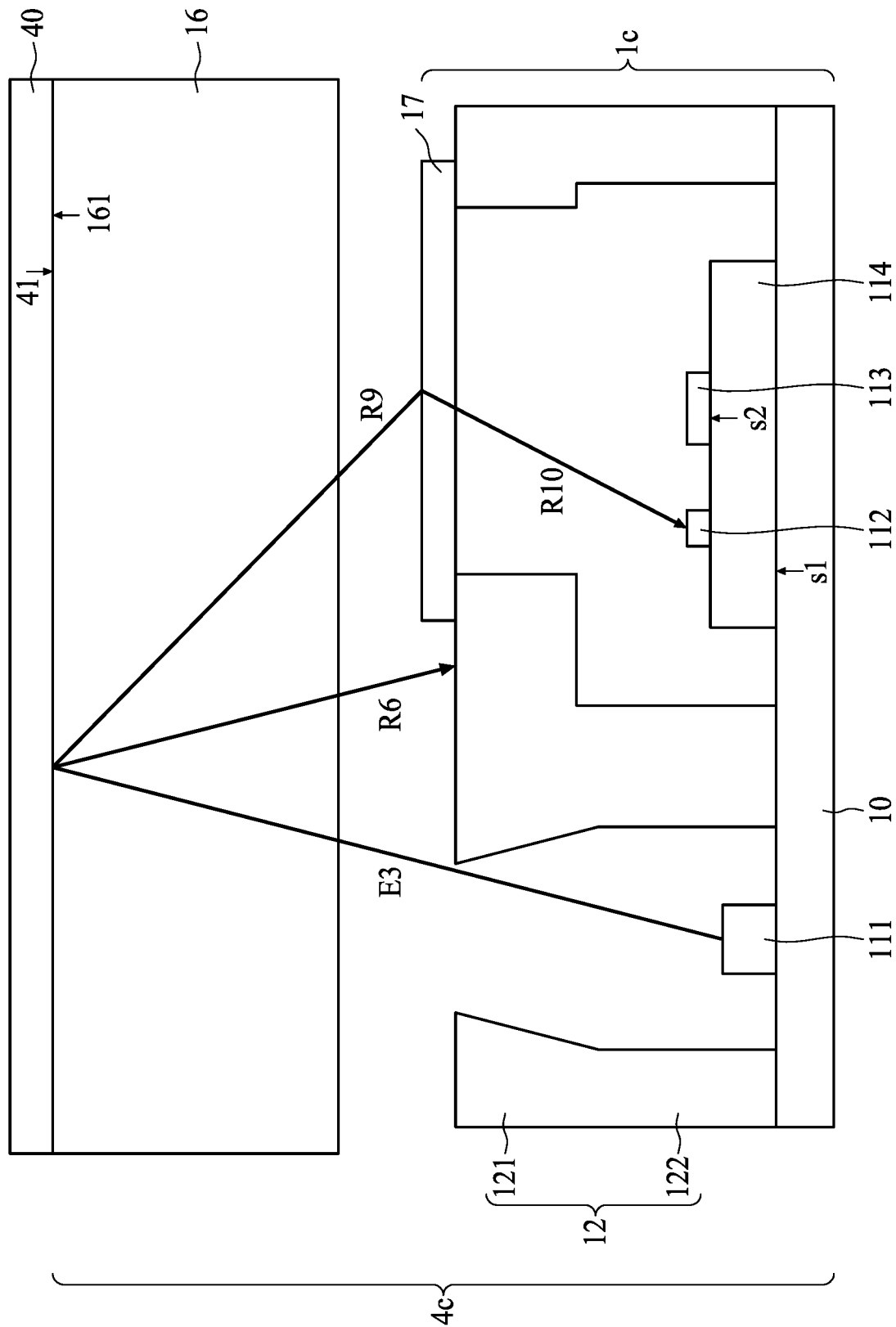
FIG. 10C illustrates light paths of an electronic device in accordance with some embodiments of the subject application.

FIG. 10C illustrates light paths of an electronic device 4c in accordance with some embodiments of the subject application. The electronic device 4c is similar to the electronic device 4b illustrated and described with reference to FIG. 10A, except that a diffuser 17 is disposed on the opening o2. The target 40 is placed very close to the transparent plate 16. In other words, the distance between the surface 41 of the target 40 and the surface 161 of the transparent plate 16 is almost zero.

The diffuser 17 may include a transparent plate with a relatively rough surface. The diffuser 17 may include a transparent plate with a relatively rough top surface. The diffuser 17 may include a transparent plate with a relatively rough bottom surface. The diffuser 17 may include a transparent plate having a rough portion of a surface. The diffuser 17 may include material similar or identical to that of the transparent plate 16. The diffuser 17 is disposed on the opening o2.

For example, in operation, the light beam E3 emitted from the emitter 111 may be reflected by the surface 41, which is very close or substantially in contact with the transparent plate 16. The reflected light beam R6 is blocked by the lid 12. The reflected light beam R9 arrives at the diffuser 17. The refracted light beam R10 is redirected by the diffuser 17 and arrives at the sensor 112.

Figure 10D:
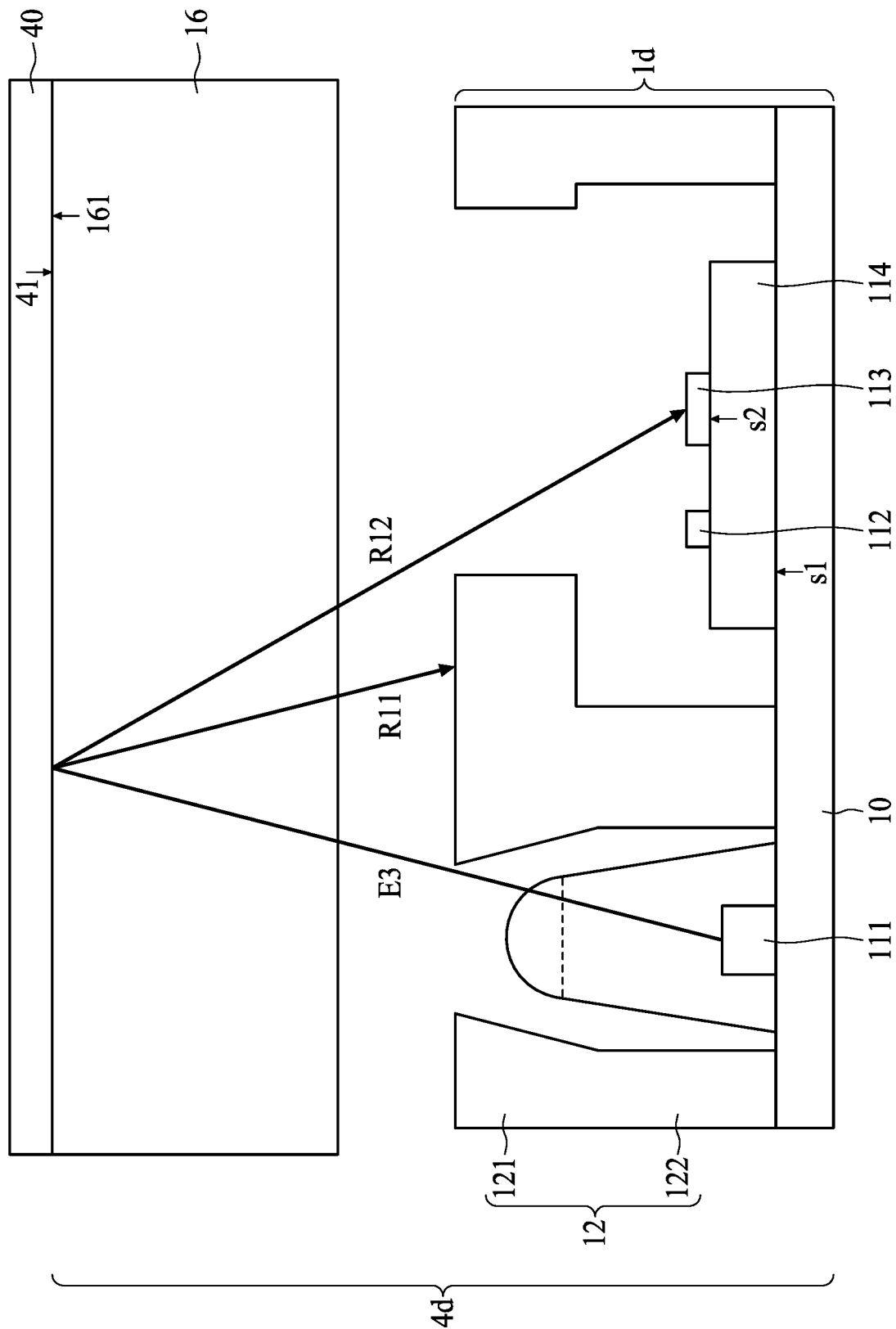
FIG. 10D illustrates light paths of an electronic device in accordance with some embodiments of the subject application.

FIG. 10D illustrates light paths of an electronic device 4d in accordance with some embodiments of the subject application. The electronic device 4d is similar to the electronic device 4b illustrated and described with reference to FIG. 10A, except that a transparent encapsulant 13' illustrated and described with reference to FIG. 7B is disposed on the surface s1 of the carrier 10. The target 40 is placed very close to the transparent plate 16. In other words, the distance between the surface 41 of the target 40 and the surface 161 of the transparent plate 16 is almost zero.

For example, in operation, the light beam E3 emitted from the emitter 111 may be reflected by the surface 41, which is very close or substantially in contact with the transparent plate 16. The reflected light beam R11 is blocked by the lid 12. The reflected light beam R12 arrives at the sensor 113.

Figure 11A:
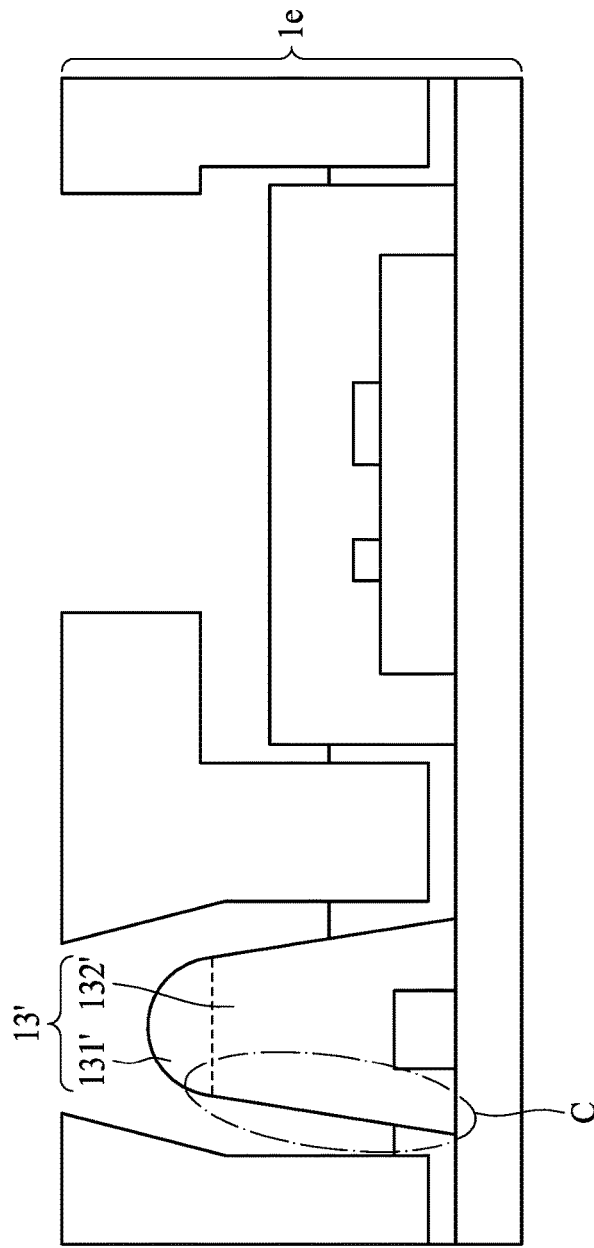
FIG. 11A illustrates a cross-sectional view of a semiconductor device package in accordance with some embodiments of the subject application.

FIG. 11A is a cross-sectional view of a semiconductor device package 1e in accordance with some embodiments of the subject application. The semiconductor device package 1e is similar to the semiconductor device package 1 illustrated and described with reference to FIG. 1A, except that the transparent encapsulant 13 of the semiconductor device package 1 is replaced by the transparent encapsulant 13' illustrated and described with reference to FIG. 7B.

Both the semiconductor device package 1e and the transparent encapsulant 13' package are a non-final stage product. The transparent encapsulant 13' may be formed by the manufacturing process shown in FIGS. 7A and 7B. In other words, no cutting process is performed on the transparent encapsulant 13'.

Figure 11D:
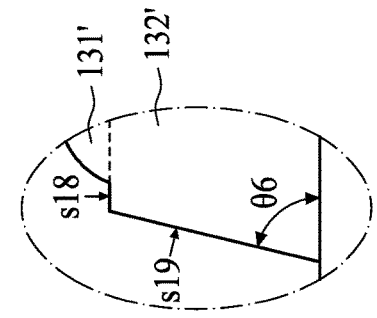
FIG. 11D illustrates an enlarged view of a portion of the semiconductor device package shown in FIG. 11A, in accordance with some embodiments of the subject application.
Figure 11C:
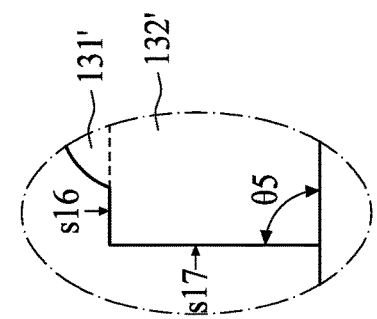
FIG. 11C illustrates an enlarged view of a portion of the semiconductor device package shown in FIG. 11A, in accordance with some embodiments of the subject application.
Figure 11B:
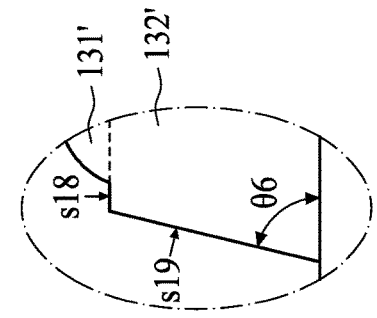
FIG. 11B illustrates an enlarged view of a portion of the semiconductor device package shown in FIG. 11A, in accordance with some embodiments of the subject application.

FIG. 11B is an enlarged view of a portion of the semiconductor device package 1e encircled by the circle C shown in FIG. 11A in accordance with some embodiments of the subject application. The transparent encapsulant 13' has a surface s15 extending from the lens portion 131' toward the surface s1 of the carrier 10. In some embodiments, the angle θ4 between the surface s15 and the surface s1 of the carrier 10 is smaller than 90°.

In some embodiments, the surface s15 is a curved surface. In some embodiments, the surface s15 is a planar surface. Since the angle θ4 between the surface s15 and the surface s1 is less than 90°, the sensor 112 of the semiconductor device package 12 receives a relatively low power signal compared to the sensor 112 of the semiconductor device package 1 or 2.

FIG. 11C illustrates an enlarged view of a portion of the semiconductor device package 1e encircled by the circle C shown in FIG. 11A, in accordance with some embodiments of the subject application. The transparent encapsulant 13' has a surface s16 connecting the lens portion 131' and parallel to the surface s1 of the carrier 10. The transparent encapsulant 13' has a surface s17 extending from the surface 16 toward the surface s1 of the carrier 10. In some embodiments, the angle θ5 between the surface s17 and the surface s1 is approximately 90°.

Due to the surface s16, the horizontal/lateral distance between the surface s17 of the body 132' and the emitter 111 is increased accordingly. In addition, the surface s16 also blocks a portion of the light beam emitted from the emitter 111. Therefore, the sensor 112 of the semiconductor device package 12 receives a relatively low power signal compared to the sensor 112 of the semiconductor device package 1 or 2.

FIG. 11D is an enlarged view of a portion of the semiconductor device package 1e marked by the circle C shown in FIG. 11A, in accordance with some embodiments of the subject application. The transparent encapsulant 13' has a surface s18 connecting the lens portion 131' and parallel to the surface s1 of the carrier 10. The transparent encapsulant 13" has a surface s19 extending from the surface s18 toward the surface s1 of the carrier 10. In some embodiments, the angle θ6 between the surface s19 and the surface s1 is less than 90°.

Due to the surface s18 and the angle θ6, the horizontal/lateral distance between the surface s19 of the body 132' and the emitter 111 is increased accordingly. In addition, the surface s18 also blocks a portion of the light beam emitted from the emitter 111. Therefore, the sensor 112 of the semiconductor device package 12 receives a relatively low power signal compared to the sensor 112 of the semiconductor device package 1 or 2.

In summary, in some embodiments, the subject application provides a semiconductor device package including a transparent encapsulant (including a lens portion and a body) with a planar surface. Therefore, the semiconductor device package may allow relatively more light beams from the emitter to enter the proximity sensor. A relatively great space between the lid and the transparent encapsulant is provided to place adhesive which attaches the lid to the carrier. The relatively small transparent encapsulant may help achieve miniaturization of the package.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if the difference between the values is less than or equal to ±10% of the average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" vertical or perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if the displacement between the two surfaces is not greater than 5 μm, not greater than 2 μm, not greater than 1 μm, or not greater than 0.5 μm. A surface can be deemed to be planar or substantially planar if the displacement of the surface relative to a flat plane between any two points on the surface is not greater than 5 μm, not greater than 2 μm, not greater than 1 μm, or not greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified herein, the electrical conductivity of a material is measured at room temperature.

As used herein, the singular terms "a," "an," and "the" may include plural referents unless the context clearly indicates otherwise. In the description of some embodiments, a component provided "on" or "over" another component can encompass cases where the former component is directly on (e.g., in physical contact with) the latter component, as well as cases where one or more intervening components are located between the former component and the latter component.

Spatial terms, such as "above," "below," "up," "left," "right," "down," "top," "bottom," "vertical," "horizontal," "side," "higher," "lower," "upper," "over," "under," "downward," and so forth, are used to indicate positions with respect to the orientation shown in the figures unless otherwise specified. It should be understood that the spatial terms used herein are for illustration purposes only, and that practical implementations of the structures described herein can be spatially arranged in any orientation or manner, provided that such arrangement does not deviate from the spirit of the embodiments of the subject application.

While the subject application has been described and illustrated with reference to specific embodiments thereof, these descriptions and illustrations do not limit the subject application. It can be clearly understood by those skilled in the art that various changes may be made, and equivalent components may be substituted within the embodiments without departing from the true spirit and scope of the subject application as defined by the appended claims. The illustrations may not necessarily be drawn to scale. There may be distinctions between the artistic renditions in the subject application and the actual apparatus, due to variables in manufacturing processes and such. There may be other embodiments of the subject application which are not specifically illustrated. The specification and drawings are to be regarded as illustrative rather than restrictive. Modifications may be made to adapt a particular situation, material, composition of matter, method, or process to the objective, spirit and scope of the subject application. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the subject application. Therefore, unless specifically indicated herein, the order and grouping of the operations are not limitations of the subject application.

What is claimed is:

1. A semiconductor device package, comprising:
    a carrier having a first surface;
    an emitter disposed on the first surface; and
    a first transparent encapsulant encapsulating the emitter, the first transparent encapsulant comprising a body and a lens portion disposed on the body, the lens portion having a first planar surface and the body having a first planar surface,
        wherein the first planar surface of the lens portion is substantially coplanar with the first planar surface of the body,
        wherein the lens portion has a first curved surface and the body has a first curved surface, and wherein the first curved surface of the body extends continuously from the first curved surface of the lens portion to the carrier.

2. The semiconductor device package of claim 1, wherein the first planar surface of the body is substantially vertical to the first surface of the carrier.

3. The semiconductor device package of claim 1, wherein the first planar surface of the lens portion is substantially vertical to the first surface of the carrier.

4. The semiconductor device package of claim 1, wherein the first planar surface of the lens portion has a first surface roughness and the first curved surface of the lens portion has a second surface roughness, and wherein the first surface roughness is different from the second surface roughness.

5. The semiconductor device package of claim 4, wherein the first surface roughness is greater than the second surface roughness.

6. The semiconductor device package of claim 1, wherein the first curved surface of the lens portion has a first surface roughness and the first planar surface of the body has a third surface roughness, and wherein the first surface roughness is substantially the same as the third surface roughness.

7. The semiconductor device package of claim 1, wherein the first curved surface of the lens portion has a second surface roughness and the first curved surface of the body has a fourth surface roughness, and wherein the second surface roughness is substantially the same as the fourth surface roughness.

8. The semiconductor device package of claim 1, further comprising a lid disposed on the first surface of the carrier, wherein the lid has a first opening on the emitter.

9. The semiconductor device package of claim 8, wherein a first distance between the first planar surface of the body and the lid is greater than a second distance between the first curved surface of the body and the lid.

10. The semiconductor device package of claim 8, further comprising a first adhesive between the first transparent encapsulant and the lid, wherein the first adhesive has a first height between the first planar surface of the body and the lid and the first adhesive has a second height between the first curved surface of the body and the lid, and wherein the first height is less than the second height.

11. The semiconductor device package of claim 10, wherein the first adhesive comprises optically reflective material.

12. The semiconductor device package of claim 10, wherein the first adhesive comprises opaque material.

13. The semiconductor device package of claim 1, wherein the first planar surface of the lens portion extends from the first curved surface of the lens portion.

14. The semiconductor device package of claim 1, wherein a first angle is formed between the first planar surface of the body and the first surface of the carrier, and a second angle is formed between a second surface of the body and the first surface of the carrier, wherein the first angle is different from the second angle.

15. The semiconductor device package of claim 1, further comprising:
    a semiconductor device disposed on the first surface of the carrier; and
    a first sensor and a second sensor disposed on the semiconductor device, wherein the first sensor is disposed relatively closer to the emitter than the second sensor.

16. The semiconductor device package of claim 1, wherein an end of the first curved surface of the lens portion meets an end of the first planar surface of the lens portion.

17. A semiconductor device package, comprising:
    a carrier having a first surface;
    an emitter disposed on the first surface; and a first transparent encapsulant encapsulating the emitter, the first transparent encapsulant comprising a body and a lens portion disposed on the body, the lens portion having a first planar surface and the body having a first planar surface, wherein the first planar surface of the lens portion is substantially coplanar with the first planar surface of the body, wherein the body has a first curved surface, wherein the first planar surface of the body has a third surface roughness and the first curved surface of the body has a fourth surface roughness, and wherein the third surface roughness is different from the fourth surface roughness.

18. The semiconductor device package of claim 17, wherein the third surface roughness is greater than the fourth surface roughness.

19. The semiconductor device package of claim 17, further comprising a lid disposed on the first surface of the carrier, wherein the lid has a first opening on the emitter, and wherein a first distance between the first planar surface of the body and the lid is greater than a second distance between the first curved surface of the body and the lid.

20. A semiconductor device package, comprising:
a carrier having a first surface;
an emitter disposed on the first surface; and
a first transparent encapsulant encapsulating the emitter, the first transparent encapsulant comprising a body and a lens portion disposed on the body, the lens portion having a first planar surface and the body having a first planar surface, wherein the first planar surface of the lens portion is substantially coplanar with the first planar surface of the body, wherein the body has a first curved surface, and wherein a first distance between the first planar surface of the body and the emitter is less than a second distance between the first curved surface of the body and the emitter.

21. The semiconductor device package of claim 20, wherein a first angle is formed between the first planar surface of the body and the first surface of the carrier, and a second angle is formed between the first curved surface of the body and the first surface of the carrier, wherein the first angle is different from the second angle.

22. The semiconductor device package of claim 20, further comprising a lid disposed on the first surface of the carrier and a first adhesive between the first transparent encapsulant and the lid, wherein the first adhesive has a first height between the first planar surface of the body and the lid, and the first adhesive has a second height between the first curved surface of the body and the lid, and wherein the first height is less than the second height.

* * * * *